US006946882B2

(12) United States Patent
Gogl et al.

(10) Patent No.: US 6,946,882 B2
(45) Date of Patent: Sep. 20, 2005

(54) CURRENT SENSE AMPLIFIER

(75) Inventors: Dietmar Gogl, Essex Junction, VT (US); William Robert Reohr, Ridgefield, CT (US); John Kenneth DeBrosse, Colchester, VT (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/326,367

(22) Filed: Dec. 20, 2002

(65) Prior Publication Data

US 2004/0120200 A1 Jun. 24, 2004

(51) Int. Cl.[7] .............................................. G01R 19/00
(52) U.S. Cl. ....................................................... 327/53
(58) Field of Search .............................. 327/51–53, 56, 327/58–60, 65–66, 69, 81, 89, 99, 309, 321, 328, 407, 408, 560–563; 365/205–207

(56) References Cited

U.S. PATENT DOCUMENTS

| | | | | | |
|---|---|---|---|---|---|
| 5,663,915 | A | * | 9/1997 | Mobley | ....................... 365/208 |
| 5,694,363 | A | * | 12/1997 | Calligaro et al. | ............ 365/190 |
| 5,939,903 | A | * | 8/1999 | Lin | .............................. 327/57 |
| 6,191,989 | B1 | * | 2/2001 | Luk et al. | ..................... 365/207 |
| 6,259,644 | B1 | | 7/2001 | Tran et al. | |
| 6,269,040 | B1 | | 7/2001 | Reohr et al. | |
| 6,379,978 | B2 | | 4/2002 | Goebel et al. | |
| 6,385,079 | B1 | | 5/2002 | Tran | |
| 6,400,607 | B1 | * | 6/2002 | Pasotti et al. | .......... 365/185.21 |
| 6,456,525 | B1 | | 9/2002 | Perner et al. | |
| 6,473,336 | B1 | | 10/2002 | Nakajima et al. | |
| 6,473,349 | B1 | | 10/2002 | Flannagan | |
| 6,480,412 | B1 | | 11/2002 | Bessho et al. | |
| 6,567,299 | B2 | | 5/2003 | Kunikiyo et al. | |
| 6,574,129 | B1 | | 6/2003 | Tran | |
| 6,678,189 | B2 | | 1/2004 | Tran | |
| 6,683,807 | B2 | | 1/2004 | Hidaka | |
| 6,700,814 | B1 | | 3/2004 | Nahas et al. | |

FOREIGN PATENT DOCUMENTS

| EP | 0 936 627 A1 | 8/1999 |
|---|---|---|
| WO | WO 02/29776 A1 | 4/2002 |

OTHER PUBLICATIONS

Fox, R.M., et al., "Leveraged Current Mirror Op Amp," Analog Integrated Circuits and Signal Processing, vol. 35, pp. 25–31, 2003, Kluwer Academic Publishers, The Netherlands.

* cited by examiner

*Primary Examiner*—My-Trang Nu Ton
(74) *Attorney, Agent, or Firm*—Slater & Matsil, L.L.P.

(57) ABSTRACT

A symmetrical high-speed current sense amplifier having complementary reference cells and configurable load devices that eliminates architecture-related capacitive mismatch contributions. The current sense amplifier is adapted for use in a symmetric sensing architecture and includes a configurable load device. The current sense amplifier includes a voltage comparator, a first clamping device coupled between a first input of the voltage comparator and a first input signal, the first clamping device being coupled to a reference voltage. A second clamping device is coupled between the second input of the voltage comparator and a second input signal, the second clamping device being coupled to the reference voltage. The load device may comprise a current mirror that is coupled between the first and second input of the voltage comparator. The current mirror may be configurable by select transistors. Alternatively, the load device may be a hard-wired current mirror, and a multiplexer may be used to select whether the first input signal or the second input signal is connected to a first or second side of the current mirror. Configurable dummy loads may be added at appropriate nodes to optimize the capacitive load and increase the speed of the amplifier. Equalization devices may be coupled between the first and second inputs of the voltage comparator, and between the first input signal and the second input signal.

36 Claims, 9 Drawing Sheets

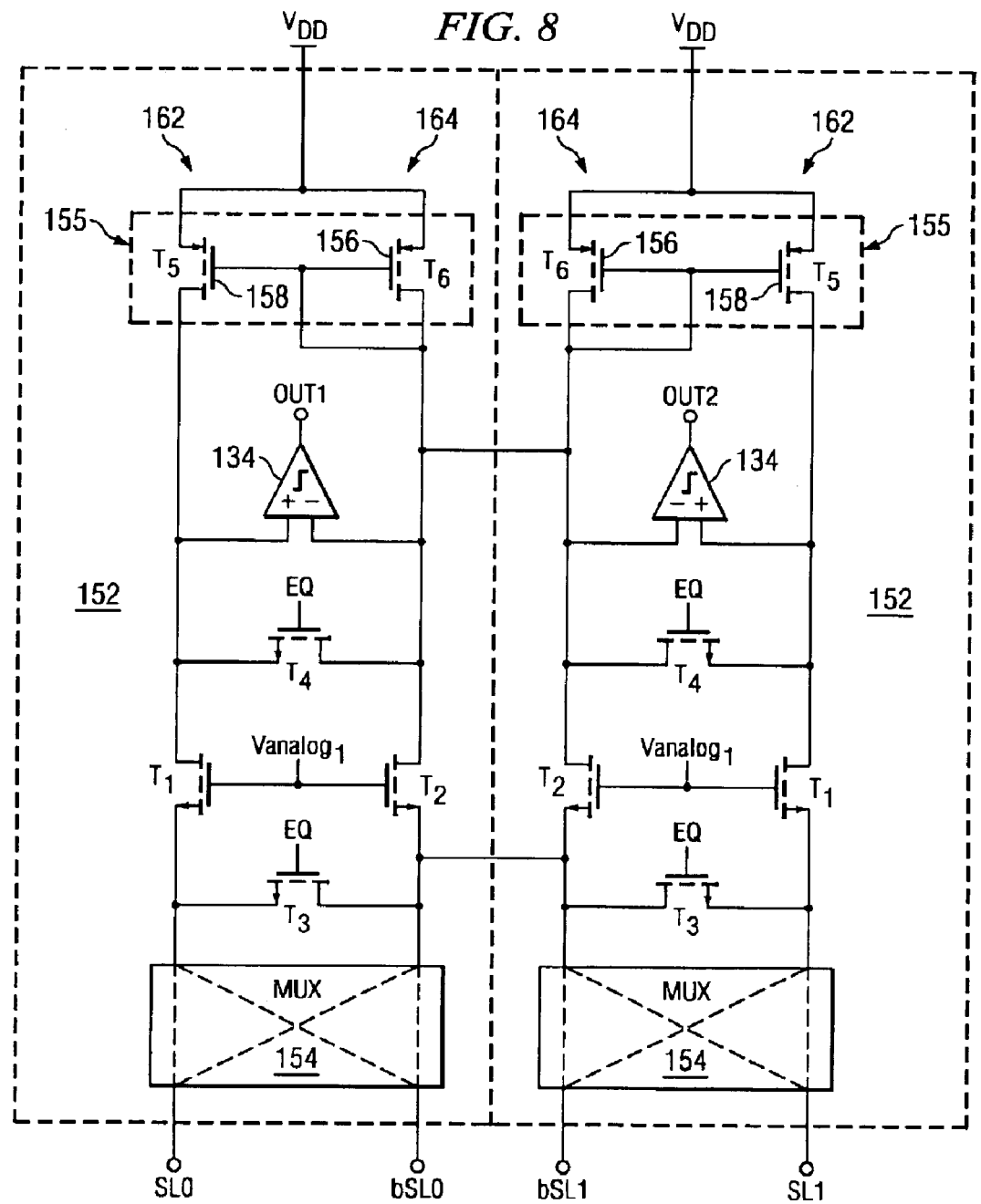

CURRENT SENSE AMPLIFIER

This invention was made with U.S. Government support under MDA972-99-C-0009 awarded by the Defense Advanced Research Projects Agency (DARPA). The U.S. Government has certain rights in this invention.

TECHNICAL FIELD

Embodiments of the present invention relate generally to semiconductor memory devices, and more particularly to sensing circuits for determining the resistive state of memory cells.

BACKGROUND

Semiconductors are used in integrated circuits for electronic applications, including radios, televisions, cell phones, and personal computing devices, as examples. One type of semiconductor device is a semiconductor storage device, such as a dynamic random access memory (DRAM) and flash memory, which uses a charge to store information.

Spin electronics, which combines semiconductor technology and magnetics, is a more recent development in semiconductor memory devices. The spin of an electron, rather than the charge, is used to indicate the presence of a "1" or "0". One such spin electronic device is a resistive memory device referred to as a magnetic random access memory (MRAM), which includes conductive lines positioned perpendicular to one another in different metal layers, the conductive lines sandwiching a magnetic stack which functions as a memory cell. The place where the conductive lines intersect is called a cross-point. A current flowing through one of the conductive lines generates a magnetic field around the conductive line and orients the magnetic polarity of one layer of the magnetic stack. A current flowing through the other conductive line induces the magnetic field and can partially turn the magnetic polarity, also. Digital information, represented as a "0" or "1", is storable in the alignment of magnetic moments in the magnetic stack. The resistance of the magnetic stack depends on the moment's alignment. The stored state is read from the magnetic stack by detecting the component's resistive state. An array of memory cells may be constructed by placing the conductive lines in a matrix structure having rows and columns, with the magnetic stack being placed at the intersection of the conductive lines.

An advantage of MRAMs compared to traditional semiconductor memory devices, such as DRAMs, is that MRAMs are non-volatile. This is advantageous because a personal computer (PC) utilizing MRAMs would not have a long "boot-up" time as with conventional PCs that utilize DRAMs, as an example.

FIG. 1 illustrates a magnetic tunnel junction (MTJ) stack that comprises a resistive or magnetic memory cell. The terms "memory cell" and "MTJ stack" are used interchangeably herein and refer to the MTJ shown in FIG. 1. The MTJ comprises two ferromagnetic layers M1 and M2 that are separated by a tunnel layer TL. The MTJ stack is positioned at the cross-point of two conductors, referred to as a wordline WL and a bitline BL. One magnetic layer M1 is referred to as a free layer, and the other magnetic layer M2 is referred to as a fixed layer. The magnetic orientation of the free layer M1 can be changed by the superposition of the magnetic fields caused by programming current $I_{BL}$ that is run through the bitline BL and the programming current $I_{WL}$ that is run through the wordline WL. A bit, e.g., a "0" or "1", may be stored in the MTJ stack by changing the orientation of the free magnetic layer relative to the fixed magnetic layer. If both magnetic layers M1 and M2 have the same orientation, the MTJ stack has a low resistance $R_C$. The resistance $R_C$ is higher if the magnetic layers have opposite magnetic orientations.

In some MRAM memory array designs, the MTJ stack is combined with a select transistor X1, as shown in FIG. 2, which is a cross-sectional view of a 1T1MTJ design (one transistor and one MTJ stack). A schematic diagram of the MTJ stack and select transistor X1 is shown in FIG. 3. A bitline BL is coupled to one side of the MTJ stack, and the other side of the MTJ stack is coupled to the drain D of a select transistor X1 by metal layer MX, via VX, and a plurality of other metal and via layers, as shown. The source S of the transistor X1 is coupled to ground (GND). X1 may comprise two parallel transistors that function as one transistor, as shown in FIG. 2. Alternatively, X1 may comprise a single transistor, for example. The gate G of the transistor X1 is coupled to a read wordline (RWL), shown in phantom, that is preferably positioned in a different direction than, e.g., perpendicular to, the bitline BL direction.

The select transistor X1 is used to access the memory cells MTJ. In a read (RD) operation during current sensing, a constant voltage is applied at the bitline BL. The select transistor X1 is switched on, e.g., by applying a voltage to the gate G by the read wordline RWL, and current then flows through the bitline BL, the magnetic tunnel junction MJT, over the MX layer, down the metal and via stack, through the transistor drain D, and through the transistor X1 to ground GND. This current is then measured and is used to determine the resistance of the MJT, thus determining the programming state of the MJT. To read another cell in the array, the transistor X1 is switched off, and the select transistor of the next cell is switched on.

The programming or write operation is accomplished by programming the MTJ at the cross-points of the bitline BL and programming line or write wordline WWL using selective programming currents. For example, a first programming current $I_{BL}$ passed through the bitline BL causes a first magnetic field component in the MJT stack. A second magnetic field component is created by a second programming current $I_{WL}$ that is passed through the write wordline WWL, which may run in the same direction as the read wordline RWL of the memory cell, for example. The superposition of the two magnetic fields produced by programming currents $I_{BL}$ and $I_{WL}$ causes the MJT stack to be programmed. To program a particular memory cell in an array, typically a programming current is run through the write wordline WWL, which activates all cells along that particular write wordline WWL. Then, a current is run through one of the bitlines, and the magnetic field switches only the MJT stack at the cross-point of the write wordline WWL and the selected bitline BL.

The resistance difference between programmed and unprogrammed MRAM memory cells is relatively small. For example, the MJT may be in the order of a 10 k ohm junction, and there is a change of about 20% in the resistance when a magnetic field is applied at the MJT. This changes the sense value from 10 k ohm to between about 6 to 8 k ohm, e.g., 7 k ohm. For other memory devices such as flash memory cells or static random access memory (SRAM) cells, there is a larger resistance difference between programmed and unprogrammed memory cells than in MRAMs. For example, if a flash cell is activated, the "on" resistance is about 5 k ohms, and the "off" resistance is infinite. While other types of memory cells completely switch on or off, an MRAM cell only has a small change in the resistance value upon programming. This makes MRAM cell sensing more difficult.

Either current sensing or voltage sensing can be used to detect the state of memory cells. DRAMs usually are sensed using voltage sensing, for example. In voltage sensing, the bitline is precharged, e.g., to 1 volt, with the memory cell not activated. When the memory cell is activated, the memory cell charges or discharges the bitline and changes the voltage of the bitline. However, in some types of memory cells, the memory cell is small, and the bitline length may be long, e.g., may extend the entire width of the chip. The memory cell may not be able to provide enough cell current to discharge or charge a large bitline capacity within a required time. This results in an excessive amount of time being required to read the memory cells. Therefore, voltage sensing is not a preferred choice of sensing scheme for some memory devices, such as MRAM devices.

Current sensing may be used to detect a resistance change of resistive memory cells. Current sensing is the desired method of sensing the state of MRAM cells, for example. In current sensing, a voltage is applied to the bitline, and the bitline voltage is kept constant with a sense amplifier. The cell current is directly measured, with the cell current being dependent on the resistance of the memory cell being read. The use of current sensing reduces the capacitive load problem from long bitlines that may occur in voltage sensing.

In MRAM device current sensing, a voltage is applied to the bitline, and the current change at the bitline due to the resistance change of the magnetic tunnel junction is measured. However, because the resistance difference between a programmed and unprogrammed cell is small in MRAM memory cells, the current difference sensed is also smaller than the current change from a flash or an SRAM cell, for example. What is needed in the art is an improved current sensing design for memory devices.

SUMMARY OF THE INVENTION

Embodiments of the present invention achieve technical advantages as a current sense amplifier that is particularly useful in sensing current in resistive memory devices. A symmetrical high-speed current sense amplifier is disclosed that comprises complementary reference cells and configurable sensing paths that eliminate architecture-related capacitive mismatch contributions. The current sense amplifier is adapted for use in a symmetric sensing architecture, and includes at least one current mirror that may be configured using switching transistors, or a multiplexer may be used to select the input signal that is connected to the first or second side of the current mirror.

In accordance with a preferred embodiment of the present invention, a current sense amplifier includes a voltage comparator having a first input, a second input and an output, and a first clamping device coupled between the first input of the voltage comparator and a first input signal. A second clamping device is coupled between the second input of the voltage comparator and a second input signal. The first clamping device and the second clamping device are coupled to a reference voltage. A configurable load device is coupled between the first and second input of the voltage comparator.

In accordance with another preferred embodiment of the present invention, a current sense amplifier includes a voltage comparator having a first input, a second input and an output, and a first clamping device coupled between the first input of the voltage comparator and a first input signal, the first clamping device being coupled to a reference voltage. A second clamping device is coupled between the second input of the voltage comparator and a second input signal, the second clamping device being coupled to the reference voltage. The current sense amplifier includes a load device having a first side and a second side. The current sense amplifier includes a multiplexer, wherein the multiplexer is adapted to select whether the first input signal or second input signal is connected to the first or second side of the load device.

In accordance with yet another preferred embodiment of the present invention, a memory device includes an array of memory cells, the memory cells having a first side and a second side, wherein at least two of the memory cells comprise reference cells. A plurality of parallel wordlines are coupled proximate the first side of the memory cells, the wordlines running in a first direction. A plurality of parallel bitlines are coupled proximate the second side of the memory cells. The memory device includes a symmetric sensing circuit including at least one column selector and at least one current sense amplifier, the column selector being coupled to the memory array and comprising at least one column select transistor coupled to each bitline in the array. The current sense amplifier includes a voltage comparator, a first clamping device, a second clamping device, and a current mirror having a first side and a second side. The voltage comparator includes a first input, a second input and an output. A first input signal is coupled to the voltage comparator first input, a second input signal is coupled to the voltage comparator second input, and the first and second input signals comprise either current from a selected memory cell or current from at least one reference cell. The voltage comparator outputs a logic state of the selected memory cell.

Another preferred embodiment of the invention is a method of sensing current. The method includes providing a first transistor and a second transistor, providing a first input signal having a first voltage and a first current, and clamping the first voltage and passing the first current to the first transistor. The method includes providing a second input signal having a second voltage and a second current, and clamping the second voltage and passing the second current to the second transistor, wherein the first input signal and second input signal comprise either current from a selected memory cell or current from at least one reference cell. The method includes selectively mirroring the first or second current from the first or second transistor to the second or first transistor, and comparing the voltage across the first or second transistor to the voltage across the second or first transistor, wherein selectively mirroring the current amplifies the voltage difference between the voltage across the first transistor and the voltage across the second transistor.

Advantages of embodiments of the present invention include increased performance and speed in reading information stored in memory devices. Capacitive load devices may be used to increase performance and balance capacitive loads. The configurable current mirror may be achieved by using select transistors, or a multiplexer may be used to select the input signal that is connected to the first or second side of the current mirror. In one embodiment, one of two transistors of the current mirror is selectable to function as a transistor diode. In another embodiment, the transistors of the current mirror are hard-wired but the input signal that is connected to the first or second side of the current mirror is selected by a multiplexer in the sense amplifier input path.

The foregoing has outlined rather broadly the features and technical advantages of embodiments of the present invention in order that the detailed description of the invention that follows may be better understood. Additional features and advantages of embodiments of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 8 shows an embodiment of the present invention with a fixed/hard-wired load device and having multiplexing devices between the bitline clamp devices and the sense lines at the sense amplifier inputs;

DETAILED DESCRIPTION OF ILLUSTRATIVE EMBODIMENTS

Figure 1:
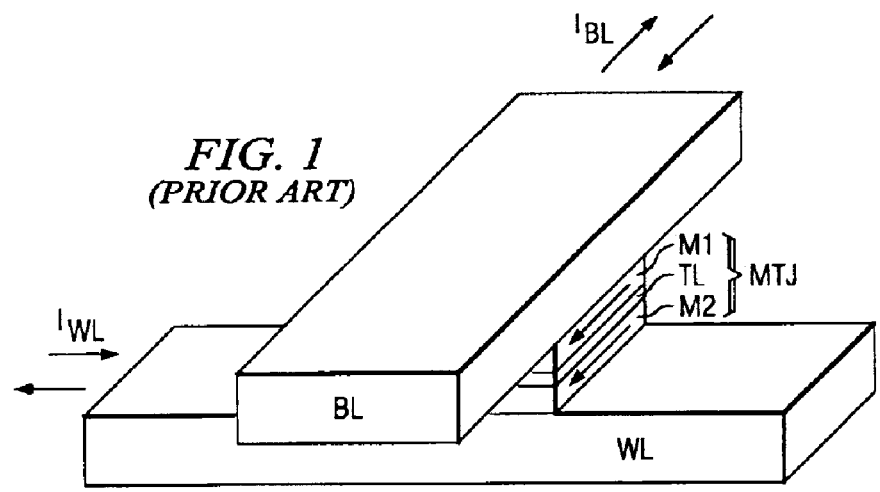
FIG. 1 shows a perspective view of an MTJ stack.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention will be described with respect to preferred embodiments in a specific context, namely a FET MRAM device. The invention may also be applied, however, to resistive memory devices and other memory devices that use a current sense amplifier to detect the resistive state of memory cells. The current sense amplifier is also applicable in other applications where an unknown current is compared to a reference current in order to read or sense the unknown current.

In resistive memory devices such as MRAMs, current sensing circuits may be either asymmetric or symmetric. An asymmetric sense amplifier scheme 11 is shown in the prior art drawing of FIG. 4. Shown is an example for a current sensing scheme 11 for a 1T1MTJ memory cell using averaging of reference cells $RC_1$ and $RC_2$ to produce a reference current. The current sensing scheme 11 comprises a current sense amplifier 12 and a column selector 14 coupled to a memory array 16.

Only one memory cell 10 is shown; however, there may be hundreds or thousands of memory cells in the array 16. The reference cells $RC_1$ and $RC_2$ preferably reside in the array with the memory cells 10, but the reference cells $RC_1$ and $RC_2$ may alternatively reside in another array 16, for example. Reference cell $RC_1$ may comprise a cell programmed as a logic 1, and reference cell $RC_2$ may comprise a cell programmed as a logic 0, for example. Each bitline BL containing a memory cell 10 is connected to at least one column select transistor X2 of the column selector 14. The column selector 14 is connected to the sense amplifier 12. The bitline clamp transistor X3 is coupled to a multiplexer (not shown) that is coupled to a plurality of other memory cells, each via a column select transistor (also not shown). Cell 10, $RC_1$ and $RC_2$ are located on bitlines selected by the column selector 14. These cells are shown as examples for cells on the bitlines.

Figure 4:
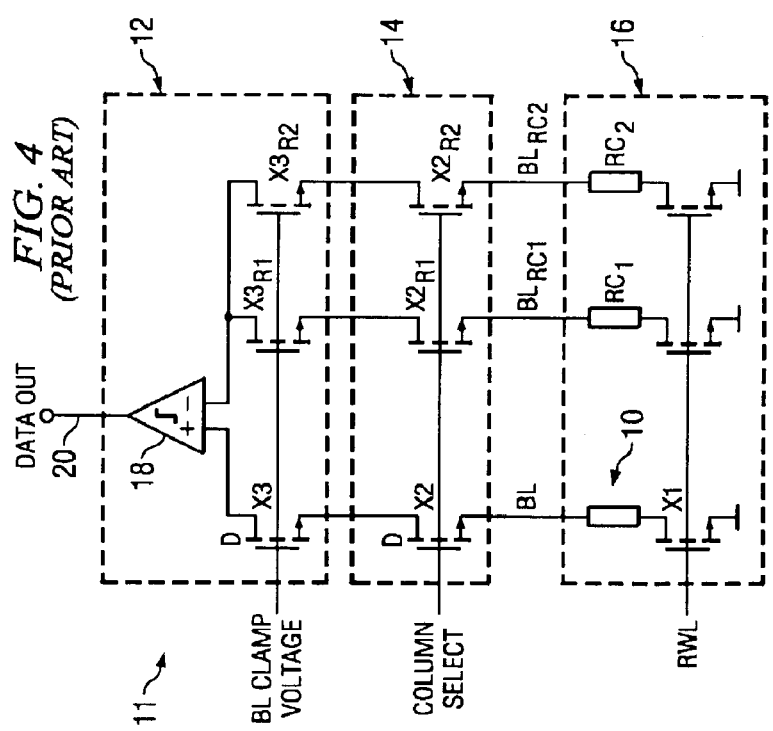
FIG. 4 is a schematic of an asymmetric sensing circuit that averages the current of two reference cells.

As current sensing is used in FIG. 4, the selected bitlines are kept at a constant potential by bitline clamping transistors X3 during the read operation. The current comparator 18 compares the currents of the selected memory cell 10 with the averaged current of reference cells $RC_1$ and $RC_2$. The level of the reference cell current is the approximate midpoint between the current of a selected cell with a "0" state and a selected cell with a "1" state, in MRAM applications. Alternatively, the current sense amplifier 12 may use only one reference cell, not shown, in other applications.

A read wordline RWL is coupled to the gate of the select transistor X1 of the selected cell 10. If the read wordline RWL is activated, then all of the select transistors X1 in that row of the memory array 16 are switched on. The column select transistor X2 of the column selector 14 is used to select the correct bitline BL (e.g., the column of the selected memory cell 10). The column selector 14 switches the bitline BL of the selected cell to the direction of the sense amplifier 12. The current sense amplifier 12 reads the resistive state of the selected cell 10 by measuring the current. The current sense amplifier 12 comprises a current comparator 18 coupled to transistor X3 and transistors $X3_{R1}$ and $X3_{R2}$ of the reference paths for reference cells $RC_1$ and $RC_2$. The current sense amplifier 12 maintains a constant bitline BL voltage during a read operation, using transistors X3 that are coupled to the signal "BL clamp voltage."

Transistors X3 typically comprise source-follower transistors, for example. The current comparator 18 compares the current through transistor X3 of the selected cell 10 with the average of the currents through $X3_{R1}$ and $X3_{R2}$ of the reference cells, to determine the resistive state of selected cell 10, which information is output (indicated by "DATA OUT") as a digital "1" or "0" at node 20 of the current sense amplifier 12.

The sensing scheme 11 shown in FIG. 4 is disadvantageous in that it has an asymmetric structure. Two bitlines for only two reference cells $RC_1$ and $RC_2$ and column selector switches $X2_{R1}$, $X2_{R2}$ are connected to the right side (the negative input) of the comparator 18, while only one bitline and a large number of column selector switches X2 are connected to the left side (the positive input) of the current comparator 18 of the current sense amplifier 12. For example, there may be one out of 64 bitlines of memory cells 10 coupled to the positive input of the current comparator 18, and two bitlines for reference cells coupled to the negative input of the current comparator 18. Because of this asymmetry, the capacitive load of the sensing path at the positive input of the current comparator 18 is much different from the capacitive load of the reference path at the negative input of the current comparator 18. The capacitive load comprises the capacitance of the switching transistors X3, $X3_{R1}$ and $X3_{R2}$, and the metal lines capacitively loaded by the memory cells, e.g., the bitlines BL. This makes the circuit sensitive to many noise sources coupled into the circuit during sensing, such as power supply noise, internal asymmetric coupling of switching noise, as examples, and also increases the sensing time because of different RC time constants of the sensing paths for the selected memory cell and reference cells. Mismatches in the sensing path of an MRAM memory device tend to be the main performance limiters for the array read access time.

Figure 5:
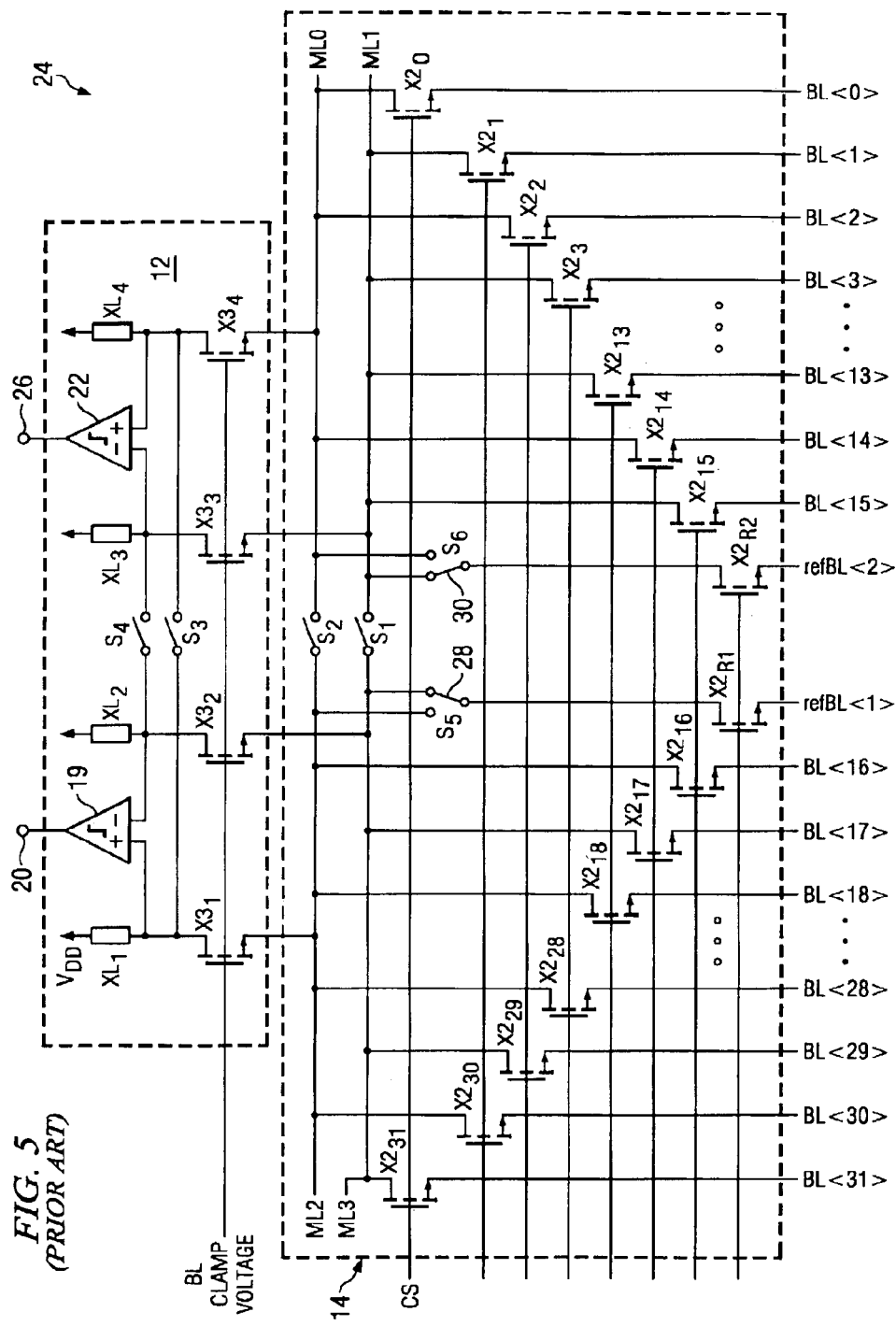
FIG. 5 is a schematic of a symmetric sensing circuit having two differential amplifiers.

A symmetric sensing scheme or circuit 24 for MRAM FET memory devices is shown in FIG. 5, which avoids the problems of the asymmetric sensing scheme 11 shown in FIG. 4. With a symmetric sensing circuit 24 such as the one shown, the inputs of the comparators 19 and 22 have approximately equal effective capacitive loads. No matter which bitline is read, the wiring of the sensing path and effective capacitive load are approximately equal at each input, which eliminates or reduces error voltages and noise. The reference path has twice the load of the sensing path, but the reference path is connected to two sense amplifier inputs (the negative inputs of comparators 19 and 22). Therefore, the RC constant in both sense amplifier paths is equal, and therefore the effective capacitive load is equal. The memory array 16 is not shown in FIG. 5; however, a memory array 16 is coupled to the column selector 14, as shown in FIG. 4.

The current sense amplifier 12 comprises a first and second voltage comparator 19 and 22, each having an output 20 and 26. The load devices $X_{L1}$, $X_{L2}$, $X_{L3}$, and $X_{L4}$ preferably comprise transistors, the load devices being the same type of devices (e.g., having the same load characteristics). Half of the select transistors $X2_{31}$, $X2_{30}$ ... $X2_{16}$, $X2_{R1}$ (and corresponding memory cells 10 in the array 16) along the bitlines BL<31> through BL<16>, refBL<1> are coupled to the first voltage comparator 19, and the other half of the select transistors $X2_{R2}$, $X2_{15}$ ... $X2_{1}$, $X2_{0}$ are coupled to a second voltage comparator 22. In this scheme 24, both sides of each current comparator 19 and 22 have the same transient behavior because of the equal effective capacitive and resistive loads on the first and second voltage comparators 19 and 22. While 16 bitlines are shown on each side in FIG. 5, there may be more bitlines, e.g., 32 or 64, as examples.

For comparator 19, odd bitlines BL<31> through BL<17> are coupled to a masterline ML3 by corresponding column select transistors $X2_{31}$ through $X2_{17}$, and even bitlines BL<30> through BL<16> are coupled to a masterline ML2 by corresponding column select transistors $X2_{30}$ through $X2_{16}$. Similarly, for comparator 22, odd bitlines BL<15> through BL<1> are coupled to a masterline ML1 by corresponding column select transistors $X2_5$ through $X2_1$, and even bitlines BL<14> through BL<0> are coupled to a masterline ML0 by corresponding column select transistors $X2_{14}$ through $X2_0$. Therefore, the capacitive load of the bitlines is distributed half to the lower masterlines ML3 and ML1 and half to the upper masterlines ML0 and ML2. If an odd bitline is selected, the capacitive load is distributed to a lower masterline ML3 or ML1, for example. The reference bitlines refBL<1> and refBL<2> may be coupled either to the masterline ML3 or ML2, or ML1 or ML0, respectively (whichever is not being used by the selected cell), using switches $S_5$ and $S_6$, for example.

The selection of a memory cell at bitline BL<31> will next be described. Column select transistor $X2_{31}$ is switched on, which connects bitline BL<31> to the lower masterline ML3. The column select transistors $X2_{R1}$ and $X2_{R2}$ for the reference cells are switched on, and the connections 28 and 30 in switch $S_5$ and $S_6$, respectively, are made to the top masterlines ML2 and ML0. Switch $S_2$ between the top masterlines ML2 and ML0 is closed in order to average the reference cell currents. Switch $S_1$ between the two lower masterlines ML3 and ML1 stays open.

In the symmetric sense circuit 24 arrangement with odd and even bitlines being connected to two separate masterlines, the effective capacitive load seen at the inputs of the voltage comparators 19 and 22 is substantially equal. In particular, the RC time constants of the sensing paths including masterline ML1 or ML3 is approximately equal to the RC time constants of the two sensing paths connected to the shorted masterline ML2/ML0. During a read operation, the lower masterlines ML1 and ML3 have eight transistors $X2_{31}$, $X2_{29}$ to $X2_{17}$ and $X2_{15}$, $X2_{13}$ to $X2_1$ and one bitline associated with the selected cell or reference cell, respectively, connected to them, and the top masterlines ML2 and ML0 have eight transistors $X2_{30}$, $X2_{28}$ to $X2_{16}$ and $X2_{14}$, $X2_{12}$ to $X2_0$ and one bitline associated with the selected cell or reference cell, respectively, connected to them. While the top masterlines ML2 and ML0 also have reference transistors $X2_{R1}$ and $X2_{R2}$ connected to them, this is not a significant difference in capacitance. So, the symmetric structure produces a symmetric effective capacitive load at the inputs of the voltage comparators 19 and 22. Note that if a bitline is chosen that is connected to a lower masterline, the reference cells should be connected to an upper masterline. Similarly, if a bitline is chosen that is connected to an upper masterline, the reference cells should be connected to a lower masterline. The connection of the reference cells to the upper or lower masterlines ML2/ML0 or ML1/ML3 is made by switches $S_5$ and $S_6$.

Next, the averaging of the two reference cell currents will be described, with reference to the current sense amplifier 12 portion of the symmetric sense circuit 24 of FIG. 5. Assume for purposes of this discussion that the reference bitlines are connected to the bottom masterline ML1/ML3, and the selected cell bitline is connected to the top masterline ML2/ML0. The lower masterline switch $S_1$ connects the two reference bitlines refBL<1> and refBL<2> together. The voltage at the reference bitlines refBL<1> and refBL<2> is kept constant by the BL clamp transistors $X3_2$ and $X3_3$ The reference current of the reference bitlines refBL<1> and refBL<2> is added due to the connection of the lower masterline switch $S_1$. The reference bitlines refBL<1> and refBL<2> current flows through the bitline clamping devices $X3_2$ and $X3_3$ and through load devices $X_{L2}$ and $X_{L3}$, respectively. The reference bitlines refBL<1> and refBL<2> current is added; it flows through two parallel resistors $X_{L2}$ and $X_{L3}$ to $V_{DD}$. The selected cell is coupled to the top masterline ML2. Current from a selected cell (e.g., $X2_{28}$) flows through the BL clamping device X3, and through one load device, $X_{L1}$ to $V_{DD}$. The cell current causes a voltage shift at the load device $X_{L1}$, and the voltage comparator 19 detects this change in voltage at the load device $X_{L1}$. The load device $X_{L1}$ transforms the cell current into a voltage, according to Ohm's law.

To read a selected cell $X2_{28}$, cell current flows through the load device $X_{L1}$, is transformed to a voltage, and the voltage is seen by the positive input of voltage comparator 19. At the negative input, two load devices $X_{L2}$ and $X_{L3}$ are connected in parallel because switch $S_4$ is closed, so their total resistance is half the resistance of load device $X_{L1}$. The currents of the 1 reference bitline and the 0 reference bitline added together are approximately twice the current of a regular memory cell: This current is fed into two load devices $X_{L2}$ and $X_{L3}$ in parallel, which results in half the value of a regular load device, and this divides the current by two again. Thus, the voltage that is created at the parallel connection of load devices $X_{L2}$ and $X_{L3}$ is the averaged voltage between a 1 and a 0 reference cell, compared with a voltage of one load device $X_{L1}$.

A problem with the symmetric sensing scheme is that sometimes the top masterline ML2 is used for the sensing path (when reading an even bitline), and other times the bottom masterline ML3 is used for the sensing path (when reading an odd bitline). When the bottom masterline ML3 is used for the sensing path, then the top masterline ML2 is used for the reference cells. In this case, switch $S_2$ is closed to connect load devices $X_{L1}$ and $X_{L4}$ in parallel, and the current averaging is accomplished by the load devices $X_{L1}$ and $XL_4$. A disadvantage of this symmetric sensing structure is that a single sense amplifier cannot be used, because the averaging has to be accomplished sometimes using the bottom masterline and sometimes using the top masterline. Therefore, the structure requires two voltage comparators 19 and 22. The two voltage comparators 19 and 22 work together, achieving the averaging either using load devices $X_{L1}$ and $X_{L4}$ for the top masterline ML0 and ML2, or alternatively, using load devices $X_{L2}$ and $X_{L3}$ for the bottom masterline ML1 and ML3 in order to achieve the symmetric behavior of the sensing scheme 24.

In memory circuits there are many sources of noise, such as noise from power supplies, output buffers, or internal switching noise of the memory device itself, for example. In order to reduce the influence of these noise sources as much as possible, it is necessary to achieve the same RC time constants for the sensing paths from the selected bit lines to the sense amplifier 12 inputs. If voltage disturbances are introduced and there is an RC network, this will produce some voltage or current in the RC network. However, if there are two identical RC networks at the voltage comparator inputs, then these RC networks will have the same parasitic responses, and the noise essentially cancels itself out. The voltage comparators 19 and 22 then see the same parasitic response on both the positive and negative input, and they are not affected by the noise.

Therefore, for a symmetric sensing scheme 24, as shown in the example of FIG. 5, a sense amplifier with a symmetric sensing structure is needed in the art, to cancel out potential noise and to achieve fast read times. If there is noise in the sense amplifier, it may take a longer amount of time to read data, because it takes a while for the unwanted capacitive effects to disperse so that the data is valid. A symmetric sensing structure is needed that will cancel out the noise and thus permit faster read operations.

Embodiments of the present invention comprise a sense amplifier for use in a symmetric sense amplifier circuit such as the one shown in FIG. 5. A preferred embodiment of the invention is a current sense amplifier 32 (see FIG. 6) that can be configured to be used in a symmetric sensing concept, which is advantageous because high performance in MRAM memory devices may be achieved, even though the MRAM memory sensing signals are small.

Figure 6:
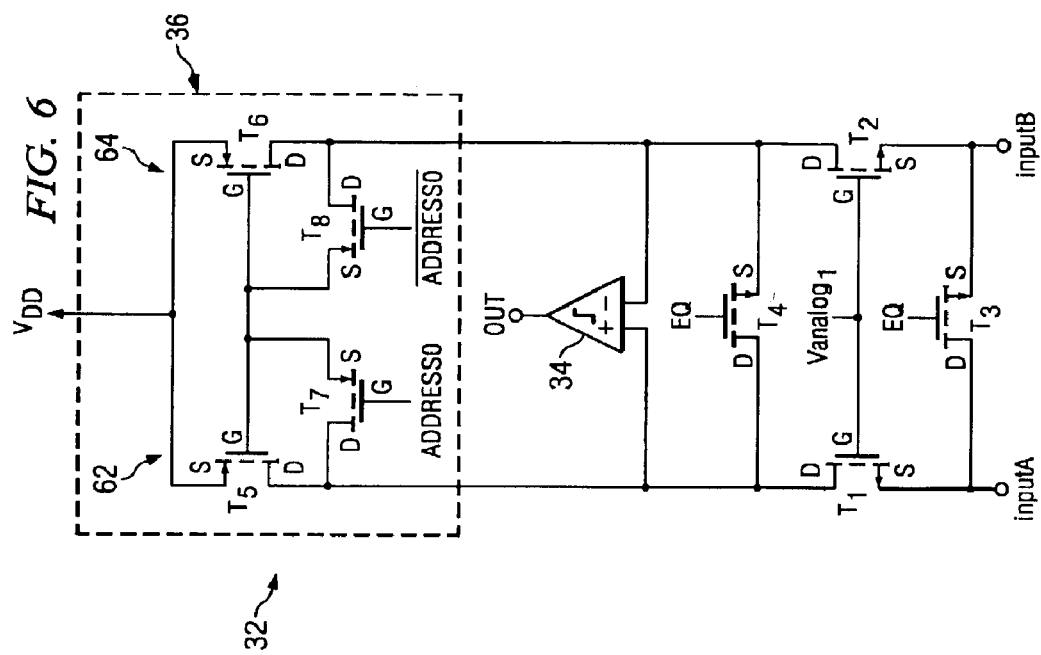
FIG. 6 shows a current sense amplifier in accordance with an embodiment of the present invention that includes a voltage comparator, bitline clamping devices, and a configurable current mirror.

FIG. 6 shows a current sense amplifier 32 in accordance with an embodiment of the invention that includes a voltage comparator 34. The drains of bitline clamping devices $T_1$ and $T_2$, which preferably comprise transistors, are coupled to the positive and negative inputs, respectively, of the voltage comparator 34. The sources of transistors $T_{1\ and\ T2}$ are connected to a first input signal inputA and a second input signal inputB, respectively, as shown. The gates of transistors $T_{1\ and\ T2}$ are connected to a reference voltage $V_{analog1}$ which preferably comprises a bitline clamp voltage (see FIG. 5). Reference voltage $V_{analog1}$ may comprise 0.7 volts, for example, although reference voltage $V_{analog1}$ may alternatively comprise other voltage levels.

The current sense amplifier 32 may include optional transistors $T_3$ and $T_4$ which function as equalizing devices. For example, the source of transistor $T_3$ may be coupled to signal inputB, the drain of transistor $T_3$ may be coupled to signal inputA, the source of transistor $T_4$ may be coupled to the negative input of the voltage comparator 34, and the drain of transistor $T_4$ may be coupled to the positive input of the comparator 34. The gates of transistors $T_3$ and $T_4$ are coupled to an equalization signal EQ. Before a read operation is started, transistors $T_3$ and $T_4$ are activated, to ensure that the input signals inputA and inputB are at the same voltage potential (e.g., equalized), and also to ensure that the inputs of the comparator 34 are equalized.

Advantageously, the current sense amplifier 32 includes a configurable load device 36 coupled to the inputs of the comparator 34. The configurable load device 36 preferably comprises a current mirror, and may alternatively comprise other asymmetric load devices, as examples. In the embodiment shown, the load device 36 comprises a current mirror 36 is configurable in that it may be configured to optimize the capacitive load at the voltage comparator inputs, e.g., either the left side 62 or the right side 64 may be selected and activated. The configurable current mirror 36 includes a first transistor $T_5$ coupled between a voltage source VDD and clamping device $T_1$, and a second transistor $T_6$ coupled between the voltage source VDD and clamping device $T_2$. The gates of transistors $T_5$ and $T_6$ are coupled together. The current mirror 36 includes a first switching transistor $T_7$ coupled between the gate and drain of transistor $T_5$, and a second switching transistor $T_8$ coupled between the gate and drain of transistor $T_6$. Either of the transistors $T_5$ or $T_6$ may be used as a transistor diode, to be described further herein. A select signal ADDRESS0 is coupled to the gate of switching transistor $T_7$, and the inverse of the select signal ADDRESS0 bar is coupled to the gate of switching transistor $T_8$. The select signal ADDRESS0 is adapted to activate either switching transistor $T_7$ or $T_8$, activating either transistor $T_5$ or $T_6$, respectively, as a transistor diode or current source, and amplifying the voltage difference at the first and second input of the voltage comparator 34. Transistors $T_5$, $T_6$, $T_7$ and $T_8$ preferably comprise PMOS transistors, and alternatively may comprise NMOS transistors, as examples.

When inputA has a reference current applied to it, transistor $T_7$ of the current mirror 36 may be activated (e.g., 0 V is applied to the gate of transistor $T_7$, to turn it on), so that transistor $T_5$ functions as a transistor diode load device. In a transistor diode configuration, if the gate of a transistor is connected to the drain, and a current is applied to the drain, then there is a voltage to the drain, and the transistor will exhibit diode behavior. When transistor $T_7$ is activated, the gate of transistor $T_5$ is connected to the drain of $T_5$, and transistor $T_5$ is configured as a transistor diode. A current applied at inputA passes through the drain of transistor $T_5$ which is connected to the gate of transistor $T_5$, creating a voltage potential between the drain and source of transistor $T_5$. This is referred to as transistor diode behavior. There is no ohmic, linear load, as in a resistor; rather, the behavior is that of a transistor diode, which is non-linear. The cell current from inputA is converted to a voltage by transistor $T_5$ (source-drain voltage), and the voltage comparator 34 sees the positive input that has been connected at the drain of transistor $T_5$. Similarly, transistor $T_6$ will function as a transistor diode load device when transistor $T_8$ is activated. When transistor $T_8$ is switched on, this connects the gate of $T_6$ to the drain of $T_6$. Current that flows into or out of inputB creates a voltage over the source-drain of the load device, transistor $T_6$.

In accordance with embodiments of the present invention, preferably, switching transistors $T_7$ and $T_8$ are not activated at the same time, because then transistors $T_5$ and $T_6$ would function as a transistor diode at the same time. To avoid activating transistors $T_7$ and $T_8$ at the same time, the signal ADDRESS0 is applied to the gate of switching transistor $T_7$, and an inverse signal ADDRESS0 bar is applied to the gate of switching transistor $T_8$. Preferably, signal ADDRESS0 is a digital signal, for example, and may comprise the least significant bit (LSB) of the column addresses of the memory array 16, as an example. When signal ADDRESS0 is activated, switching transistor $T_7$ is activated, and transistor $T_5$ functions as a transistor diode. A current at inputA then creates a drain-source voltage at transistor $T_5$. The drain-source voltage at transistor $T_5$ is also the gate-source voltage at transistor $T_5$, because switching transistor $T_7$ is activated. Switching transistor $T_8$ is not activated (because the gate is the inverse of the ADDRESS0 signal), so the gate-source voltage of transistor $T_5$ is also the gate-source voltage of transistor $T_6$, because the gates of transistors $T_5$ and $T_6$ are connected. Preferably, transistors $T_5$ and $T_6$ have the same dimensions, e.g., comprise the same type of transistors. So, if there is a current flow at transistor $T_5$, the same current flows through transistors $T_6$. Transistor $T_5$ mirrors its current over to transistor $T_6$, and thus the circuit functions as a current mirror 36.

Now, assume that inputA is connected to the selected memory cell by a column selector (signal CS in FIG. 5), and that inputB is connected to reference cells producing an average mid-current reading. The cell current is input at inputA and is mirrored from transistor $T_5$, creating a drain-source voltage at transistor $T_5$. Since the current is mirrored into transistor $T_6$, it flows through transistor $T_6$. The reference current flows into inputB at the negative input of the voltage comparator 34. If the inputB current is a little higher than the inputA current, this creates a large voltage shift at the negative input of the voltage comparator 36. The gate voltage of transistor $T_6$ is defined by transistor $T_5$. Transistor $T_6$ preferably operates in the saturation region, and it basically functions as a current source. If additional current is applied at the drain of a transistor in the saturation region, a small shift of this current creates a large shift in the drain-source voltage, causing a large amount of voltage amplification. This amplified voltage is seen by the voltage comparator 34 negative input. This creates a large difference between the negative and positive input of the voltage comparator 34, which is advantageous. Thus, a high gain is produced, because of the mirroring of the current by the current mirror 36 from one side. 64. to the other side 62, at the comparator 34.

The current sense amplifier 32 has particular advantages when used in a symmetric sensing scheme 24 shown in FIG. 5. Note that the averaging of the reference currents will be done on either the left side or the right side of each amplifier in FIG. 5, e.g., either load devices $X_{L1}$ and $X_{L4}$ are connected together by switch $S_3$, or load devices $X_{L2}$ and $X_{L3}$ are connected together using switch S4. Each load device $X_{L1}, X_{L2}, X_{L3}, X_{L4}$ must be a device such as a transistor that can be connected together with a load device of another sense amplifier 32, if necessary. As an example, referring again to FIG. 6, if a sense amplifier 32 had a hard-wired transistor diode at $T_5$ and a current source at $T_6$, in order to connect the first sense amplifier 32 to another second sense amplifier 32, then the second sense amplifier should be configured so that it fits to the first sense amplifier 32. More particularly, the two transistor diodes $T_5$ and the two current sources $T_6$ of the first and second sense amplifiers are coupled together.

Figure 14:
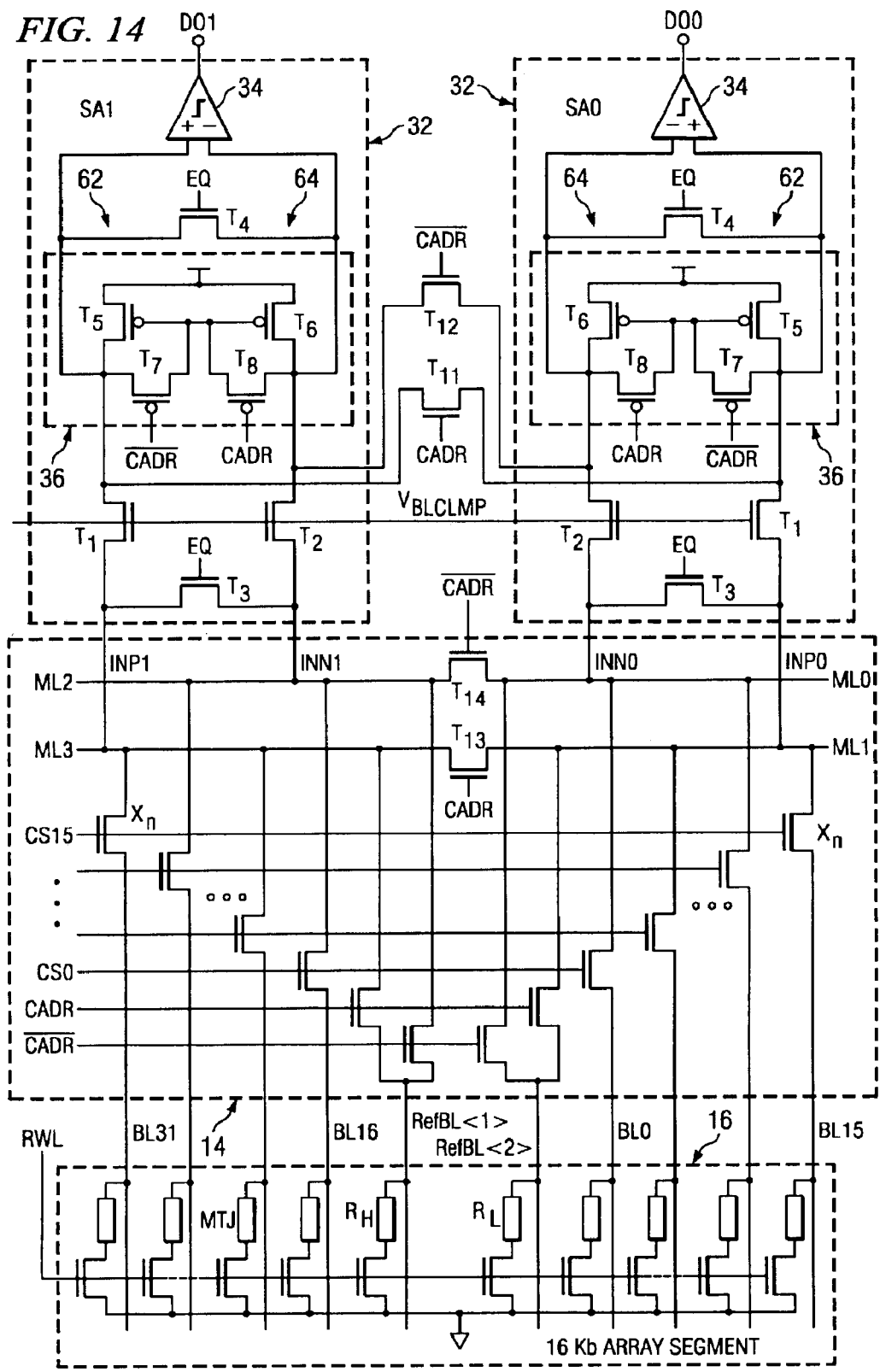
FIG. 14 shows a schematic diagram of an embodiment of the invention implemented in an MRAM design.

Therefore, two sense amplifiers 32 may be used in a symmetric sensing scheme 24 as shown in FIG. 5. To connect two sense amplifiers 32 together, signals ADDRESS0 and ADDRESS0 bar are switched so that the elements that are connected together are transistor diodes. Then if a transistor diode is needed on the right side 64, switching transistor $T_8$ is activated. If a transistor diode is needed on the left side 62, switching transistor $T_7$ is activated. Advantageously, in this' embodiment, either transistor $T_5$ or $T_6$ may be activated on either side 62/64 of the sense amplifier 32 as a transistor diode. If two sense amplifiers 32 are used in a symmetric sensing scheme, as shown in FIG. 14, then in one current sense amplifier 32, switching transistor $T_7$ can be activated, and in the other sense amplifier 32, switching transistor $T_8$ can be activated, to match the load on each side. Preferably, the comparator input having the reference current input to it is the side that is activated as a transistor diode, in accordance with an embodiment of the invention.

Referring again to FIG. 6, note that transistors $T_7$ and $T_8$ are used for switching, to select which transistor $T_5$ or $T_6$ is used as the transistor diode to mirror the current, and which is used to average the reference cell current (from refBL<1> and refBL<2> of FIG. 5). Thus, the switching transistors $T_7$ and $T_8$ of the current mirror 36 provide the configurable feature of the current mirror 36 in this embodiment.

To summarize the embodiment shown in FIG. 6, an embodiment of the present current sense amplifier 32 includes equalizing devices $T_3$ and $T_4$, voltage clamping devices $T_1$ and $T_2$, a voltage comparator 34, and a configurable current mirror 36. The configurable current mirror 36 includes two transistors $T_5$ and $T_6$, wherein one of the transistors $T_5$ or $T_6$ may be chosen to function as the transistor diode, depending on what is needed to improve the symmetry of the current sense amplifier 32 relative to the symmetric sensing architecture 24 (see FIG. 5). The input signals inputA and inputB are kept at the read voltage of the memory cell by source follower clamping devices $T_1$ and $T_2$ that are controlled by the gate reference voltage $V_{analog1}$.

The first and second input signals inputA and inputB preferably comprise either a current from a selected memory cell being read or a reference current of at least one reference cell (more preferably, the reference current comprises the averaged current from at least two reference cells), and the voltage comparator 34 is adapted to output (e.g., at "OUT") a logic state of the selected memory cell. Optional equalization switches $T_3$ and $T_4$ may be placed directly at inputA and inputB and at the positive and negative inputs of the comparator stage 34 of the sense amplifier 32. The load devices of the sense amplifier comprise a configurable current mirror 36 comprising transistors $T_5$-$T_8$. If ADDRESS0 is low and its complement high, transistors $T_5$ and $T_7$ form a transistor diode load of sense amplifier input path A. Transistors $T_6$ and $T_8$ form a current source of the load current mirror 36. For ADDRESS0 high, the current mirror 36 can be swapped, so that the transistor diode is at the right side 64 of the sense amplifier at inputB. Depending on which side 62/64 of the sense amplifier 32 has to be shared with another sense amplifier 32, this side of the amplifier 32 can be configured to be compatible.

In accordance with an embodiment of the invention, two or more current sense amplifiers 32 may be combined for use in a current sensing circuit, to be described further herein with reference to FIG. 14.

Figure 7:
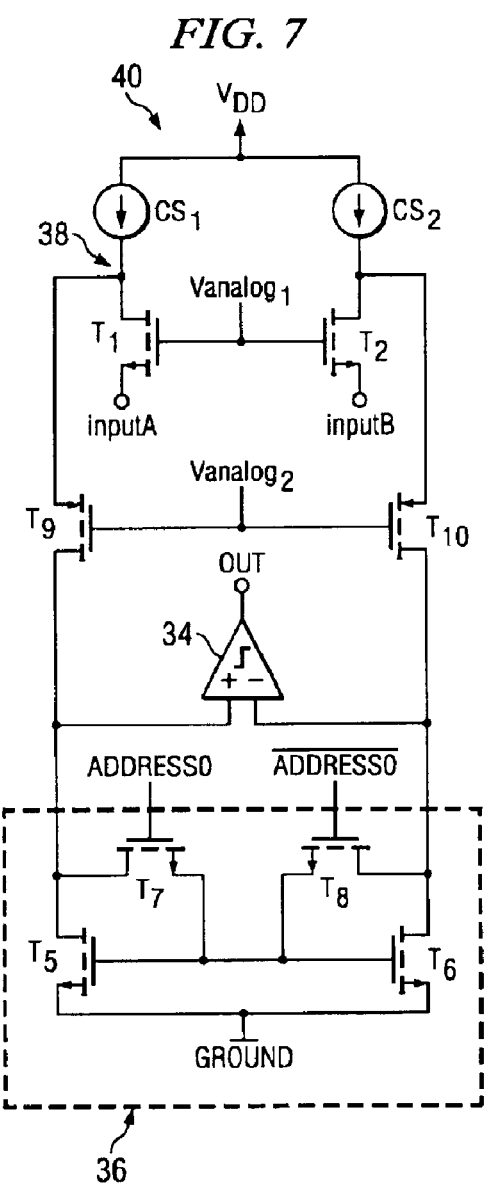
FIG. 7 shows a current sense amplifier in accordance with an embodiment of the present invention, having a cascode sense amplifier design, bitline clamping devices, and a configurable current mirror.

The accuracy of the configurable current mirror 36 may be improved by stacking additional optional cascode devices onto $T_5$ and $T_6$. FIG. 7 shows an embodiment of the present invention in which the current mirror switching technique is used in a cascode sense amplifier design 40. The circuit for a symmetric cascode current sense amplifier is shown. The input signals inputA and inputB are kept at the read voltage of the memory cells by clamping transistors $T_{1\ and\ T2}$. A cell current flows through these input transistors $T_{1\ and\ T2}$ can change the current balance in the left or right branch of the sense amplifier 40. The left branch comprises the current source $CS_1$, cascode transistor $T_9$, and one side of the current mirror 36 that includes transistors $T_5$ and $T_7$. Similarly, the right branch comprises the current source $CS_2$, cascode transistor $T_{10}$, and one side of the current mirror 36 that includes transistors $T_6$ and $T_8$.

Assuming there is no current at inputA, current flows through transistor $T_9$, and if transistor $T_7$ is activated, then $T_5$ acts as a transistor diode. So, the current $CS_1$ flows through the transistor diode $T_5$, to ground. On the right side, $CS_2$ similarly flows into transistor $T_6$, but on the right side of the configurable current mirror 36, transistor $T_6$ is configured as a current source. Therefore, there is a current mirror: transistor $T_5$ functions as a transistor diode, and transistor $T_6$ functions as a current source. When a memory cell is connected at inputA and transistor $T_1$ is activated, the current is changed slightly between current source $CS_1$ and transistor $T_5$, and the equilibrium or stable state is disturbed. This is typical of a cascode circuit—the cell current changes the current situation due to Kirchoffs law, at node 38. Similar to the embodiment shown in FIG. 6, this difference in current is mirrored from transistor $T_5$ to transistor $T_6$, and the current difference is detected by the voltage comparator 34.

The cascode devices $T_9$ and $T_{10}$ preferably comprise transistors that are coupled between the configurable current mirror 36 and the node 38 at the clamping devices $T_1$ and $T_2$. The gates of transistors $T_9$ and $T_{10}$ are coupled to a signal $V_{analog2}$, as shown, which may be a voltage less than the supply voltage VDD, e.g., ($V_{DD}$-1 volt). Current sources $CS_1$ and $CS_2$ may comprise transistors being operated in the saturated region, for example. The sources of transistor $T_9$ and $T_{10}$ are preferably at a voltage that is a threshold voltage below the voltage of $V_{analog2}$. Therefore, transistors $T_9$ and $T_{10}$ ensure that the voltage over current sources $CS_1$ and $CS_2$ are approximately constant, improving the current source $CS_1$ and $CS_2$ behavior.

Using the control signal ADDRESS0, the left or right side of the amplifier can be configured in order to work together with a second sense amplifier in a symmetric sensing concept, as shown in the example of FIG. 6. The comparator stage 34, which converts the signals at the positive and negative inputs into a digital output signal (e.g., a "1" or "0") of the amplifier, e.g., in a differential to single end conversion at signal out. Equalization devices $T_3$ and $T_4$ as shown in FIG. 6 may also be included in this embodiment. For example, a transistor $T_4$ may be coupled between the voltage comparator 34 inputs, and a transistor $T_3$ may be coupled between input signals inputA and inputB (not shown in FIG. 7; see FIG. 6).

The cascode sense amplifier 40 design is advantageous in that the capacitive behavior is improved; therefore, the cascode sense amplifier 40 may provide some speed advantages. As in the first embodiment, the configurable current mirror 36 is advantageous because two current sense amplifiers 36 may be connected together, and the reference cell currents can be averaged.

Referring to FIG. 7, a capacitive load asymmetry within the current sense amplifier will be described. When transistor $T_5$ is configured as a transistor diode, the capacitive load at the drain of $T_5$ comprises the load due to the drain of $T_5$, the gate of transistor $T_5$ (via the connection by transistor $T_7$), and also the gate load of transistor $T_6$. The capacitive load at the drain of $T_6$ comprises the load due to the drain of $T_6$, no gate load because transistor $T_8$ is not activated, and a small amount of drain load from $T_8$. Therefore, there still remains a small amount of asymmetry of capacitance within the configurable current mirror 36.

FIG. 8 illustrates yet another embodiment of the invention, a sense amplifier 152 that is adapted for use in a symmetric sensing scheme. The sense amplifier 152 comprises fixed or hard-wired load devices 155. The load devices 155 preferably comprise current mirrors and may alternatively comprise other asymmetric load devices, as examples. In the embodiment shown, the load devices 155 comprise current mirrors 155 (comprising transistors $T_5$ and $T_6$). In order to maintain the ability of the sense amplifier 152 to configure itself for a symmetric sensing configuration to balance the effective capacitive load of the voltage comparator inputs, multiplexing (e.g., using a multiplexer 154 that is placed at the input of the current sense amplifier 152) of the sensing paths is used. The multiplexer 154 is adapted to select whether the first input signal SL0 or second input signal bSL0 is connected to the first side 162 or second side 164 of the current mirror 155.

The current sense amplifier 152 includes a voltage comparator 134 having a positive (e.g., first) input and a negative (e.g., second) input, the voltage comparator 134 being adapted to output a logic state at "OUT1". A first clamping device $T_1$ is coupled between the positive input of the voltage comparator and a first input signal SL0, the first clamping device $T_1$ being coupled to a reference voltage $V_{analog1}$. A second clamping device $T_2$ is coupled between the negative input of the voltage comparator 134 and a second input signal bSL0, the second clamping device $T_2$ being coupled to the reference voltage $V_{analog1}$. The current sense amplifier 152 includes a current mirror 155 having a first side 162 and a second side 164, the current mirror first side 162 including a first transistor $T_5$ coupled between a voltage source $V_{DD}$ and the first clamping device $T_1$. The current mirror 155 second side 164 includes a second transistor $T_6$ coupled between the voltage source $V_{DD}$ and the second clamping device $T_2$. The first and second transistor $T_5$ and $T_6$ gates are coupled together, and the gate and drain of the second transistor $T_6$ are coupled together. A multiplexer 154 is coupled in the path of the input SL0 and bSL0, as shown. The multiplexer 154 is adapted to select whether the first input signal SL0 or the second input signal bSL0 is connected to the first or second side of the current mirror.

When used in a symmetric sensing architecture, preferably two or more current sense amplifiers 152 are utilized as a current sensing circuit, as shown in FIG. 8. The current sense amplifiers 152 are preferably connected at transistors $T_6$ of the current mirrors 155 of the current sense amplifiers 152. The current sense amplifiers 152 may also be connected at clamping devices $T_2$ of the current mirrors 155 of the current sense amplifiers 152, as shown.

In this embodiment, the multiplexing device or devices 154 is/are included between the BL clamp devices $T_{1\ and\ T2}$ and the column selector outputs (e.g., the inputs SL0 or bSL0 to the sense amplifier 152). The multiplexing device 154 changes the sense amplifier paths, and a column selector is utilized (not shown; see FIG. 5) to connect the selected bitlines with the inputs of sense amplifier 152. This allows the current mirror 155 devices $T_6$ and $T_5$ to be "hard-wired" together. The switching between a first side 162 and a second side 164 to optimize or balance the effective capacitive load of the comparator 134 is accomplished by the multiplexer device 154 located at the sense amplifier 152 inputs. The additional capacitance at the sense amplifier 152 input lines from the multiplexer devices 154 does not significantly affect the symmetric sensing scheme because the circuit 152 is relatively insensitive to parasitic effects at this node (e.g., below the clamping devices $T_{1\ and\ T2}$).

The multiplexing devices 154 may comprise one or more NFET devices, PFET devices, or both, for example. As shown in FIG. 8, the multiplexer 154 either connects the sense amplifier inputs "directly" to the BL clamp devices or reverses the connection, such that the data inputs SL0/SL1 are always connected to the data sides 162 of the comparators and that the reference inputs bSL0/bSL1 are always connected to the reference side 164 of the comparators (bSA). Thus, in this embodiment, the sense amplifier 152 is configurable by the multiplexers 154. The current mirror 155 is hard-wired so that transistor $T_6$ is a transistor diode, and transistor $T_5$ is a current source 158. The transistor diode $T_6$ is used in the averaging process of the reference bitlines, which can be connected together. To connect them together, the multiplexer 154 selects which signal SL0/SL1 and bSL0/bSL1 goes into either the first path 162 or second path 164 of the sense amplifier 152.

An equalizing transistor $T_3$ may be coupled between the first input signal and the second input signal, and an equalizing transistor $T_4$ may be coupled between the inputs of the voltage comparator 134, as shown. Note that the multiplexer 154 may comprise a part of the column selector 14 (see FIG. 5) rather than comprising a part of the sense amplifier 152.

Figure 9:
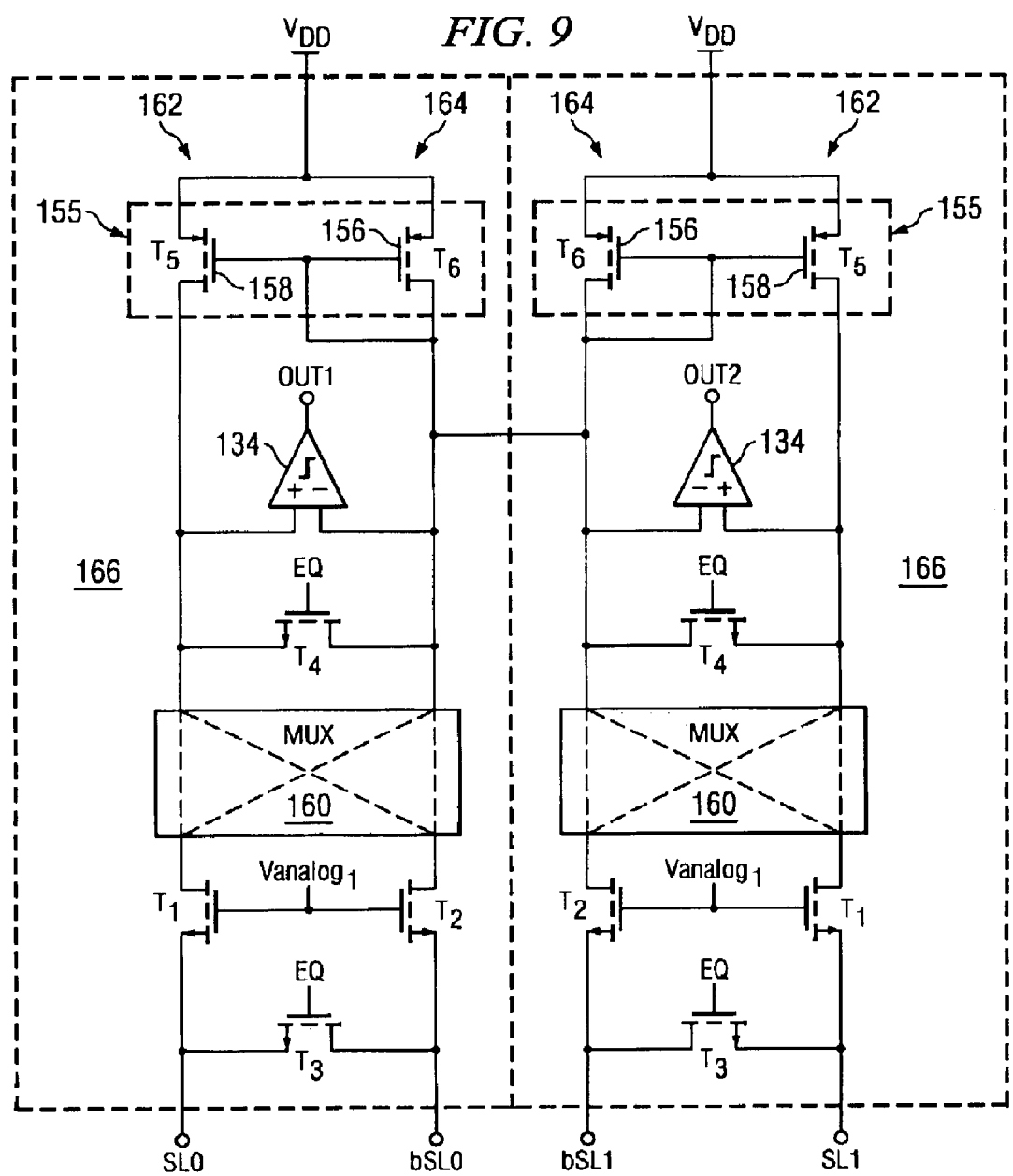
FIG. 9 illustrates an embodiment having a fixed/hard-wired load device and a multiplexer between the clamping devices and the inputs of the voltage comparator.

In FIG. 8, the multiplexer 154 adds resistance to the sensing path of the sense amplifier, which may reduce the sensed signal and may require a larger multiplexing device 154. To solve this problem, the multiplexer 160 may be disposed between the clamping devices $T_1$ and $T_2$ and the voltage comparator 134, as shown in the sense amplifier embodiment 166 of FIG. 9. This embodiment of the sense amplifier 166 is advantageous because a smaller multiplexer 160 may be used, and the sense signal is not reduced as much. As in the other embodiments, an equalizing transistor $T_3$ may be coupled between the first input signal and the second input signal, and an equalizing transistor $T_4$ may be coupled between the inputs of the voltage comparator, as shown. When used in a symmetric sensing architecture, preferably two or more current sense amplifiers 166 are utilized as a current sensing circuit, as described for the embodiment shown in FIG. 8.

Figure 10:
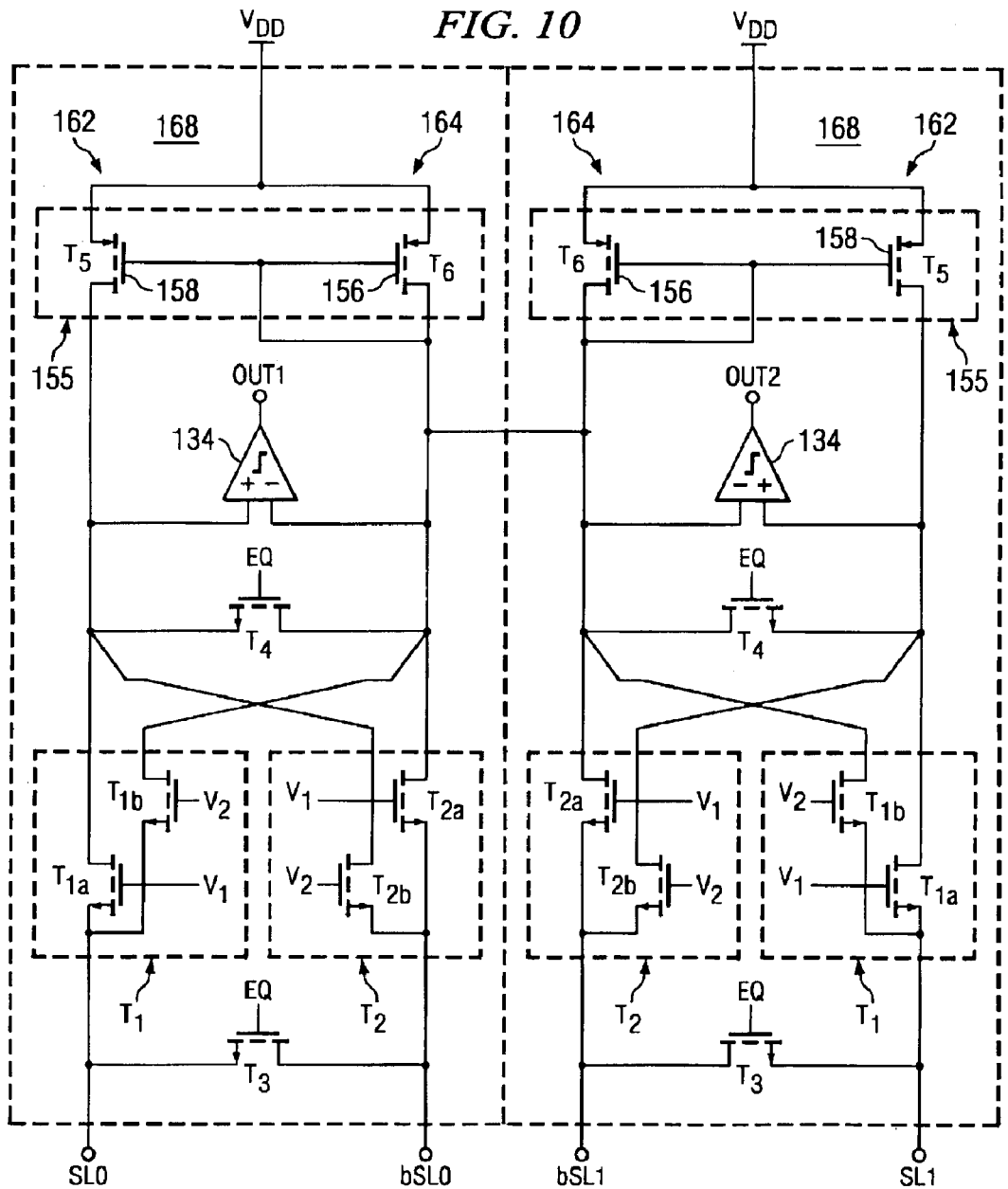
FIG. 10 shows an embodiment similar to those shown in FIGS. 8 and 9, wherein the clamping devices function as a multiplexer.

In another embodiment 168 of the invention, the current mirror transistors $T_5$ and $T_6$ of the sense amplifier are hard-wired so that one device functions as a transistor diode ($T_6$), and the multiplexing is achieved by the clamping devices $T_{1\ and\ T2}$. Shown in FIG. 10, clamping device $T_1$ comprises at least two transistors $T_{1a}$ and $T_{1b}$ and clamping device $T_2$ comprises at least two transistors $T_{2a}$ and $T_{2b}$. Transistor $T_{1a}$ is coupled to an analog signal $V_1$ at its gate, to the first input signal SL0 at its source, and to the positive input of the comparator 134 at its drain. The gate of transistor $T_{1b}$ is coupled to an analog signal $V_2$, $T_{1b}$ source is coupled to $T_{1a}$ source, and $T_{1b}$ drain is coupled to the negative input of the comparator 134. Similarly, the gate of transistor $T_{2a}$ is coupled to the analog signal $V_1$, $T_{2a}$ source is coupled to the second input signal bSL0, and $T_{2a}$ drain is coupled to the negative input of the comparator 134. The gate of transistor $T_{2b}$ is coupled to the analog signal $V_2$, $T_{2b}$ source is coupled to $T_{2a}$ source, and $T_{2b}$ drain is coupled to the positive input of the comparator 134.

Preferably, if signal $V_1$ is on, then signal $V_2$ is 0. Similarly, if signal $V_2$ is on (or high) then signal $V_1$ is 0. $V_1$ and $V_2$ are reference voltages and are preferably analog. For example, $V_1$ and $V_2$ may be $V_{analog1}$ (see description for FIG. 6) or 0 V. A circuit (not shown) may be utilized to switch signals $V_1$ and $V_2$ to $V_{analog1}$ or 0. This embodiment 168 is advantageous in that no additional multiplexing devices are required. An equalizing transistor $T_3$ may be coupled between the first input signal SL0 and the second input signal bSL0, and an equalizing transistor $T_4$ may be coupled between the inputs of the voltage comparator, as shown. As in the other hard-wired current mirror embodiments 152 and 166, when used in a symmetric sensing architecture, preferably two or more current sense amplifiers 168 are utilized as a current sensing circuit.

Figure 11:
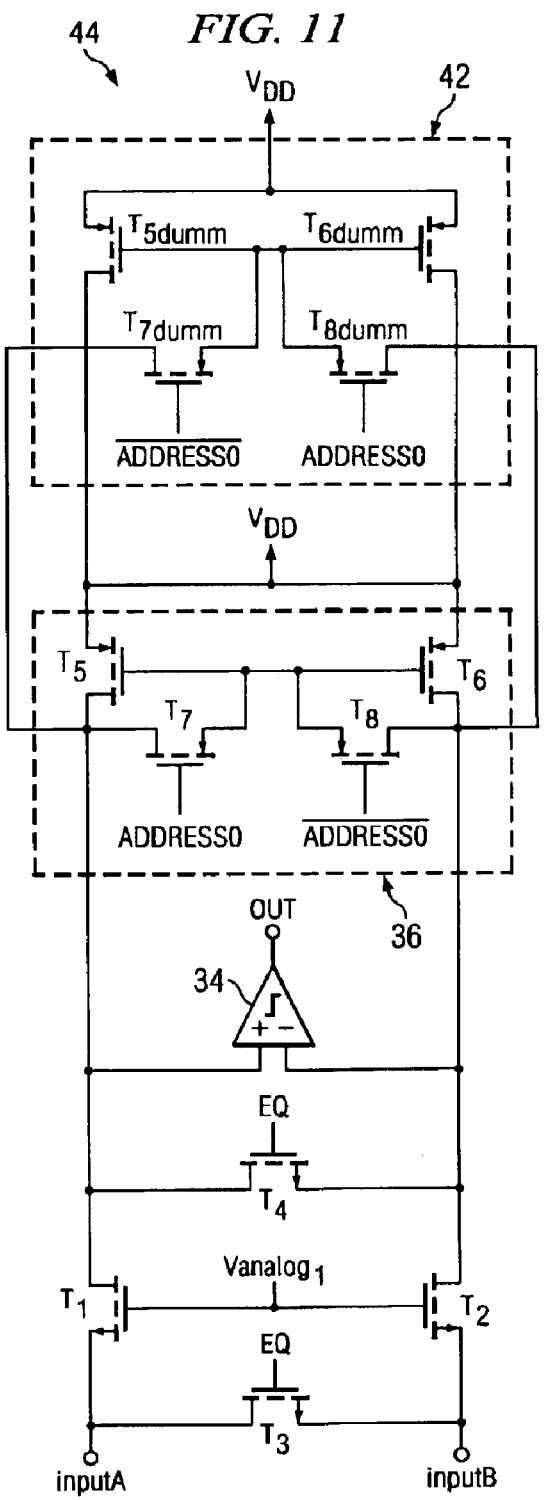
FIG. 11 illustrates a current sense amplifier in accordance with another embodiment of the present invention that includes additional dummy capacitive devices to provide balanced capacitive loads.

FIG. 11 shows an alternative embodiment 44 that may be used with the configurable current mirror embodiments described herein with reference to FIGS. 6 and 7 to reduce capacitance load asymmetry. A dummy capacitive load device 42 is coupled to the configurable current mirror 36 to achieve equal or balanced capacitive loads. The configurable dummy load device 42 preferably includes a first dummy transistor $T_{5dumm}$ coupled between the voltage source VDD and the first transistor $T_5$ of the current mirror, and a second dummy transistor $T_{6dumm}$ coupled between the voltage source VDD and the second transistor $T_6$ of the current mirror 36, wherein the gate of the second dummy transistor $T_{6dumm}$ is coupled to the gate of the first dummy transistor $T_{5dumm}$. The dummy load circuit 42 also includes a first dummy select transistor $T_{7dumm}$ coupled between the first transistor $T_5$ of the current mirror 36 and the gate of the first dummy transistor $T_{5dumm}$, the gate of the first dummy select transistor $T_{7dumm}$ being coupled to the inverse of the first select signal ADDRESS0 bar. The dummy load circuit 42 includes a second dummy select transistor $T_{8dumm}$ coupled between the second transistor $T_6$ of the current mirror 36 and the gate of the second dummy transistor $T_{6dumm}$, the gate of the second dummy select transistor $T_{8dumm}$ being coupled to the first select signal ADDRESS0. Thus, the dummy circuit 42 includes configurable dummy transistors $T_{5dumm}$ and $T_{6dumm}$ and switching devices $T_{7dumm}$ and $T_{8dumm}$ that provide symmetric capacitive loads at the comparator 34 inputs. The dummy transistors $T_{5dumm}$ and $T_{6dumm}$ may alternatively also comprise capacitors, for example.

In this embodiment, if transistor $T_5$ is configured as a transistor diode, then the drain of $T_5$ has high capacitive loads. If ADDRESS0 is activated low, then $T_{7dumm}$ is not activated, so the only capacitive load due to the dummy circuit 42 is the drain capacity of the $T_{7dumm}$, but on the right side, $T_{8dumm}$ is activated, and $T_{8dumm}$ connects the transistor $T_{5dumm}$ and $T_{6dumm}$ down to the drain of $T_6$. Therefore, the same capacitive load is seen on the right and left side of the configurable current mirror 36. With the improved matching of the capacitive load, the current sense amplifier 44 can work faster, and it makes it much easier for the voltage comparator 34 to determine the state of the selected memory cell.

During the sensing cycle, the comparator 34 input nodes (e.g., the positive and negative inputs) move towards their final value. If the two nodes have different capacitance, then the more lightly loaded side will move more quickly, creating a different signal than appears at the other input, leading to a delay in reading the true signal and hence a slower access time. A current mirror load is, by design, somewhat mismatched in capacitance in that one side includes the gate capacitance of both devices while the other side includes no gate capacitance. This effect can become quite noticeable as device sizes are increased in an effort to reduce device mismatch between the two devices.

Figure 12:
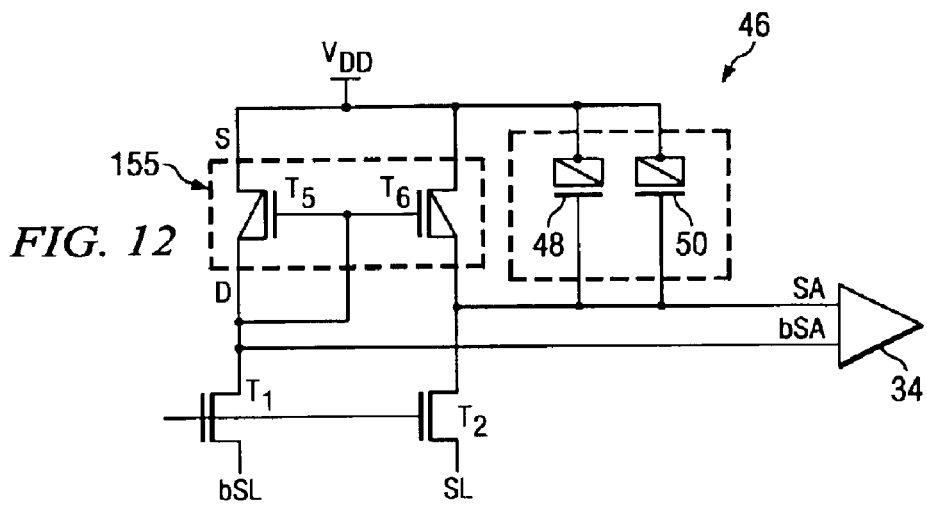
FIG. 12 shows a current sense amplifier in accordance with yet another embodiment of the present invention that includes dummy capacitive devices disposed on the side of the sense amplifier that has no gate capacitance.

A solution to this problem is shown in FIG. 12, which illustrates another embodiment 46 of the present invention. In this embodiment 46, the capacitance of the inputs of the voltage comparator 34 is matched. At least one dummy capacitive device 48 and/or 50 is included on the side that has no gate capacitance, as shown. In the example shown, the dummy capacitive device comprises two dummy gates 48 and 50 that are preferably the same size as the current mirror devices $T_5$ and $T_6$. The dummy gates 48 and 50 are coupled across the drain and source of transistor $T_6$ of the current mirror 155, as shown. The source and drain nodes of the dummy devices 48 and 50 are connected to $V_{DD}$. The dummy devices 48 and 50 preferably comprise transistors, and alternatively may comprise capacitors, for example. The dummy devices 48 and 50 balance capacitive loads of the current mirror 155. In this embodiment, there are no switching transistors required: the load current mirror devices $T_5$ and $T_6$ are hard-wired. The dummy devices 48 and 50 are preferably the same devices as the devices $T_5$ and $T_6$, to ensure that the capacitances, structure, and parasitic effects are the same. This circuit 46 results in capacitance matching of the voltage comparator 34 input nodes SA and bSA.

Figure 13:
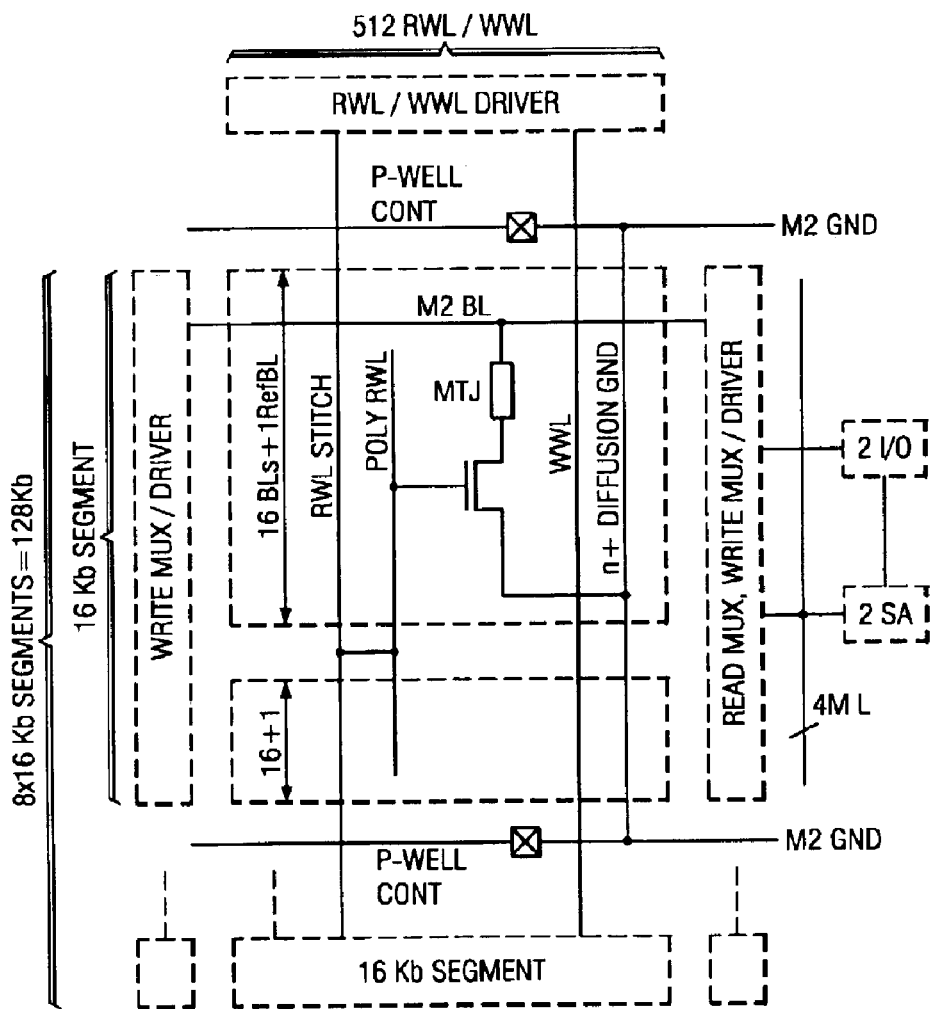
FIG. 13 shows an architecture for an MRAM device in which embodiments of the present invention may be implemented.

FIG. 13 illustrates an architecture for an MRAM device, in particular, an Array Diagnostic Monitor (ADM) core architecture, having a 1T1MTJ cell and corresponding 128 Kb core architecture. The 128 Kb ADM (512 WWLs/RWLs×256 BLs, 8 Kb×16) preferably comprises eight 16 Kb segments, each connected to two data I/Os. Interleaved layout gaps for RWL stitch and ground-supply for p-well and select device connection (source node) are preferably located every 16 BLs to minimize RWL RC delay and to assure a low resistive ground path. Uni-directional RWL/WWL and bi-directional BL drivers are located adjacent to the MRAM array. Four masterlines (ML) connect the read currents from two reference cells and from two data cells to two current sense amplifiers 32. Two reference BLs are shared within a 32 BL wide 16 Kb segment. The design features a symmetrical high speed sensing architecture comprising switched current mirror load devices as described for embodiments of the present invention herein.

FIG. 14 shows a symmetrical sensing scheme including a symmetrical column selector, sense amplifiers and reference scheme of a 128 Kb ADM in accordance with an embodiment of the present invention. Two or more current sense amplifiers 32 are utilized in the sensing scheme shown. First and second current sense amplifiers 32 may be coupled together between transistors $T_5$ and $T_6$ by connection transistors or switches $T_{11}$ and $T_{12}$, for example. Two or more of the other current sense amplifier embodiments 40, 44, 46, 152, 166, and 168 described herein may be coupled together and utilized similarly in a symmetrical sensing scheme.

The column selector 14 connects the BLs of the selected memory cells (BL31–BL16, BL15–BL0) and the two reference bit lines (refBL<1>, refBL<0>) to the input nodes of the sense amplifiers SA1 and SA0. Depending on the column select signals CS15–CS0, two even or two odd BLs are selected symmetrically to the reference BLs located in the middle of a 16 Kb segment of the memory array.

If even BLs are selected by the column selector 14, they are connected to masterlines ML2/ML0 and the reference BLs refBL<1>/refBL<2> are switched to ML3/ML1. Selected odd BLs are connected to masterlines ML3/ML1 and the reference BLs refBL<1>/refBL<2> are switched to ML2/ML0, respectively. The switching of the reference BLs is controlled by column address signal CADR (e.g., CADR is preferably driven to 1.8V for even BLs). Each masterline is also connected to one of the four sense amplifier inputs INP1/INN1 and INP0/INN0.

The symmetric structure of this interconnect network between the BLs and the sense amplifiers guarantees equal effective capacitive loads of the RC networks from the selected BLs to the sense amplifier inputs. Problems such as phase mismatch at the sense amplifier inputs, VDD noise and asymmetric coupling of noise sources into the sensing paths are significantly reduced by the use of embodiments of the present invention.

The reference scheme of FIG. 14 uses two reference BLs refBL<1>/refBL<2> as a reference for 16 BLs (BL31–BL16) to the left and 16 BLs (BL15–BL0) to the right. The MTJ's along one of the reference BLs (RefBL1) are preprogrammed into a high resistance state RH while the MTJs along the other reference BL (RefBL2) are in the low resistance state RL. The layout structure of the reference BLs is identical to BLs BL31–BL0, thereby correctly representing parameter fluctuations. During read operation the sense amplifiers apply the same BL voltage to the BLs of the selected memory cells as applied to the two reference BLs. The cell current of two reference cells along the selected RWL is averaged by the sense amplifiers and serves as midpoint current reference which is compared to the cell current of the selected memory cells.

In order to be compatible to the symmetric column selector scheme of FIG. 14, two Zsense amplifiers 32 (SA1 and SA0) are combined. During read operation, the BL voltage is clamped to about 300 mV, as an example, by the source follower transistors $T_1$ and $T_2$. Each sense amplifier uses special current mirror loads $T_5$, $T_6$, $T_7$ and $T_8$ for conversion of the cell currents into a voltage signal, which then can be evaluated by the comparators 34 of each sense amplifier 32 (SA1 and SA0) and converted into a digital output signal at DO1 and DO0.

The transistors $T_5$, $T_6$, $T_7$ and $T_8$ form two configurable current mirrors 36. Signal CADR selects which side of the current mirror loads works as transistor diode by activating one of the complementary switches $T_7$ or $T_8$. Depending on the selection of even or odd BLs by the column selector 14, the connection of the reference BLs to the sense amplifier inputs changes. Using switches $T_7$ or $T_8$, the sides of the sense amplifiers to which the reference BLs RefBL1 and RefBL0 are connected are configured as transistor diode load. These transistor diode loads of two sense amplifier sides are connected in parallel by the switches $T_{11}/T_{12}$. The averaging of the reference cell current is done at this parallel connection of transistor diode loads. Switches $T_{13}$ and $T_{14}$ may comprise transistors and are used to short the masterlines to which the reference BLs are connected directly at the sense amplifier inputs.

Figure 2:
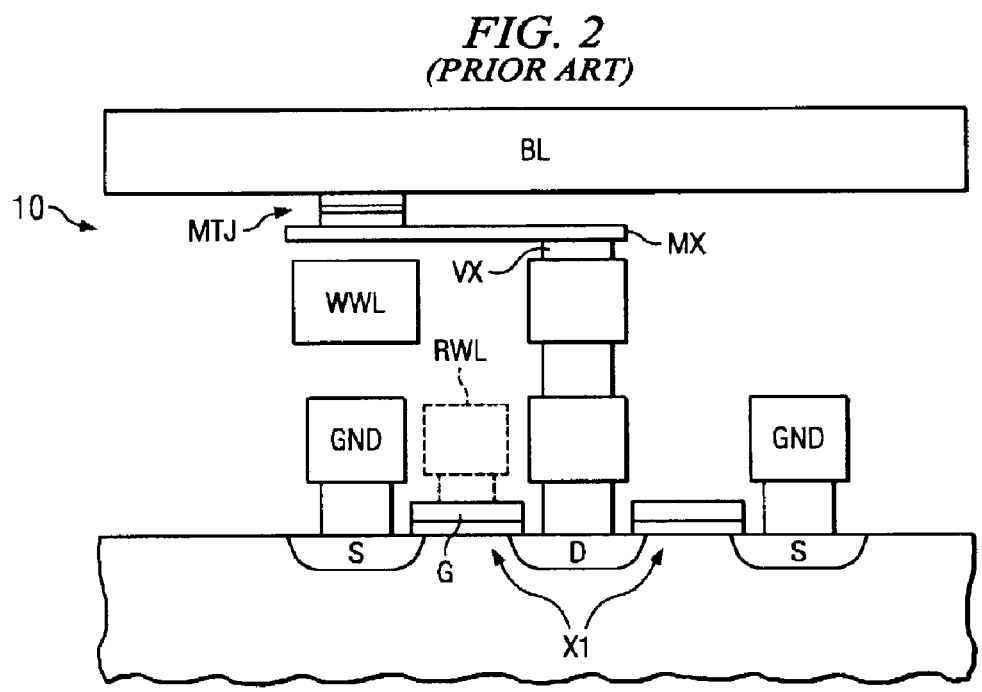
FIG. 2 shows a cross-sectional view of an MRAM memory device having a select FET.
Figure 3:
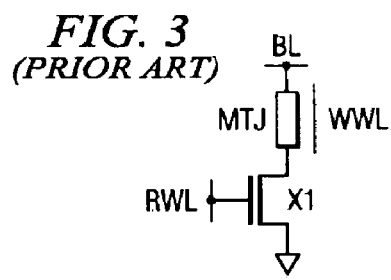
FIG. 3 is a schematic diagram of the device shown in FIG. 2.

Thus, an embodiment of the present invention includes a memory device as shown in FIG. 14 including an array 16 of memory cells MJT, the memory cells having a first side and a second side, wherein at least two of the memory cells RH and RL comprise reference cells. The memory device includes a plurality of parallel wordlines (not shown in FIG. 14; see FIGS. 1–3) coupled proximate the first side of the memory cells MTJ, the wordlines running in a first direction, and a plurality of parallel bitlines BL coupled proximate the second side of the memory cells. The memory device includes a symmetric sensing circuit 24 as described herein that includes at least one column selector 14 and at least one current sense amplifier 32, the at least one column selector 14 being coupled to the memory array 16 and comprising a column select transistor $X_n$ coupled to each bitline in the array 16. The at least one current sense amplifier 32 of the symmetric sensing circuit includes a voltage comparator 34, a first clamping device $T_1$, a second clamping device $T_2$, and a configurable load device 36 such as a current mirror 36 having a first side 62 and a second side 64, wherein the voltage comparator 34 includes a first input, a second input and an output, wherein a first input signal INP1 is coupled to the voltage comparator first input (positive input), wherein a second input signal INN1 is coupled to the voltage comparator second input (negative input), the first and second input signals comprising either current from a selected memory cell MTJ or an averaged current of two of the reference cells $R_H$ and $R_L$, and wherein the voltage comparator 34 outputs a logic state of the selected memory cell MTJ.

Another embodiment of the present invention is a method of sensing current. The method may be used, for example, to sense current from memory cells of a memory device such as the one shown in FIG. 13, for example. Referring again to FIG. 6, the method includes providing a first transistor $T_5$ and second transistor $T_6$, providing a first input signal inputA having a first voltage and a first current, clamping the first voltage (e.g., with clamping device $T_2$) and passing the first current to the first transistor $T_5$. The method includes providing a second input signal inputB having a second voltage and a second current, clamping the second voltage (e.g., with clamping device $T_2$) and passing the second current to the second transistor $T_6$, wherein the first input signal inputA and second input signal inputB comprise either current from a selected memory cell (e.g., cell 10 of FIG. 4) or an averaged current from two reference cells (e.g., reference cells $RC_1$ and $RC_2$ of FIG. 4). The method includes selectively mirroring the first or second current from the first or second transistor $T_5/T_6$ to the second or first transistor $T_6/T_5$, and comparing the voltage across the first or second transistor $T_5/T_6$ to the voltage across the second or first transistor $T_6/T_5$, wherein selectively mirroring the current amplifies the voltage difference between the voltage across first transistor $T_5$ and the voltage across the second transistor $T_6$.

Embodiments of the present invention achieve technical advantages as a current sense amplifier and memory device having a configurable load device, such that either the left path or right path of the load device may be selected. Two current sense amplifiers described herein may be used with a column selector of a symmetric sensing architecture, to provide a resistive memory device with well-matched capacitive loads, thus increasing the speed of the resistive memory device. The load device may comprise a current mirror, which provides increased gain at the voltage comparator 34, improving the performance of the memory device. The configuration of the load current mirrors is preferably achieved using gate/drain switching devices that are controlled by a digital signal (for example, a simple address signal). This is advantageous because the address signals of the memory array can be used to switch the current sense amplifier. The use of cascode devices further improves the capacitance and speed of the device. The current mirror may be configured using switching transistors, or alternatively, the current mirror can be hard-wired and a multiplexer may be used to select the side of the current mirror to be used for a particular input signal path. The multiplexer may be coupled at the sense amplifier inputs, or may be located between the clamping devices and the voltage comparator. The clamping devices may function as the multiplexer in one embodiment.

Although embodiments of the present invention and its advantages have been described in detail, it should be understood that various changes, substitutions and alterations can be made herein without departing from the spirit and scope of the invention as defined by the appended claims. For example, it will be readily understood by those skilled in the art that the circuits, circuit elements, and current sensing architectures described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A current sense amplifier, comprising:
   a voltage comparator having a first input, a second input and an output;
   a first clamping device coupled between the first input of the voltage comparator and a first input signal, the first clamping device being coupled to a reference voltage;
   a second clamping device coupled between the second input of the voltage comparator and a second input signal, the second clamping device being coupled to the reference voltage; and
   a configurable load device coupled between the first and second input of the voltage comparator, wherein the configurable load device comprises a configurable current mirror, which comprises:
- a first transistor coupled between a voltage source and the first clamping device;
- a second transistor coupled between the voltage source and the second clamping device, the first and second transistor gates being coupled together;
- a first switching transistor coupled between the first transistor gate and drain; and
- a second switching transistor coupled between the second transistor gate and drain, wherein either the first transistor or second transistor may be used as a transistor diode or a current source.

2. The current sense amplifier according to claim 1, wherein a first select signal is coupled to the first switching transistor gate, and the inverse of the first select signal is coupled to the second switching transistor gate, wherein the first select signal is adapted to activate either the first switching transistor or the second switching transistor, activating either the first transistor as a transistor diode and the second transistor as a current source, or vice versa, thus amplifying the voltage difference at the first and second input of the voltage comparator.

3. The current sense amplifier according to claim 2, further comprising a configurable dummy load circuit coupled to the configurable current mirror.

4. The current sense amplifier according to claim 3, wherein the configurable dummy load circuit comprises:
- a first dummy transistor coupled between the voltage source and the first transistor of the current mirror;
- a second dummy transistor coupled between the voltage source and the second transistor of the current mirror, wherein the gate of the second dummy transistor is coupled to the gate of the first dummy transistor;
- a first dummy select transistor coupled between the first transistor of the current mirror and the gate of the first dummy transistor, the gate of the first dummy select transistor being coupled to the inverse of the first select signal; and
- a second dummy select transistor coupled between the second transistor of the current mirror and the gate of the second dummy transistor, the gate of the second dummy select transistor being coupled to the first select signal.

5. The current sense amplifier according to claim 1, wherein the first clamping device comprises a third transistor having gate, source and a drain; wherein the gate of the third transistor is coupled to the reference voltage; wherein the source of the third transistor is coupled to the first input signal; wherein the drain of the third transistor is coupled to the first input of the voltage comparator; wherein the second clamping device comprises a fourth transistor having gate, source and a drain; wherein the gate of the fourth transistor is coupled to the reference voltage; wherein the source of the fourth transistor is coupled to the second input signal; and wherein the drain of the fourth transistor is coupled to the second input of the voltage comparator.

6. The current sense amplifier according to claim 1, further comprising a first equalizing transistor coupled between the inputs of the voltage comparator, and a second equalizing transistor coupled between the first input signal and the second input signal.

7. The current sense amplifier according to claim 1, further comprising:
- a first cascode device coupled between the configurable load device and the first clamping device; and
- a second cascode device coupled between the configurable load device and the second clamping device.

8. The current sense amplifier according to claim 1, wherein the first input signal comprises a current from a selected memory cell being read, wherein the second input signal comprises a reference current of at least one reference cell, and wherein the voltage comparator outputs a logic state of the selected memory cell.

9. The current sense amplifier according to claim 8, wherein the reference current comprises the averaged current from at least two reference cells.

10. A current sensing circuit, comprising:
a) a first current sense amplifier comprising:
1) a voltage comparator having a first input, a second input and an output;
2) a first clamping device coupled between the first input of the voltage comparator and a first input signal, the first clamping device being coupled to a reference voltage;
3) a second clamping device coupled between the second input of the voltage comparator and a second input signal, the second clamping device being coupled to the reference voltage; and
4) a configurable current mirror coupled between the first and second input of the voltage comparator, wherein the configurable current mirror comprises:
   i) a first transistor coupled between a voltage source and the first clamping device;
   ii) a second transistor coupled between the voltage source and the second clamping device, the first and second transistor gates being coupled together;
   iii) a first switching transistor coupled between the first transistor gate and drain; and
   iv) a second switching transistor coupled between the second transistor gate and drain, wherein either the first transistor or second transistor may be used as a transistor diode or a current source;
b) a second current sense amplifier comprising:
1) a voltage comparator having a first input, a second input and an output;
2) a first clamping device coupled between the first input of the voltage comparator and a first input signal, the first clamping device being coupled to a reference voltage;
3) a second clamping device coupled between the second input of the voltage comparator and a second input signal, the second clamping device being coupled to the reference voltage; and
4) a configurable current mirror coupled between the first and second input of the voltage comparator, wherein the configurable current mirror comprises:
   i) a first transistor coupled between a voltage source and the first clamping device;
   ii) a second transistor coupled between the voltage source and the second clamping device, the first and second transistor gates being coupled together;
   iii) a first switching transistor coupled between the first transistor gate and drain; and
   iv) a second switching transistor coupled between the second transistor gate and drain, wherein either the first transistor or second transistor may be used as a transistor diode or a current source;
c) a first connection transistor coupled between the first transistor of the first current sense amplifier and the first transistor of the second current sense amplifier; and d) a second connection transistor coupled between the second transistor of the first current sense amplifier and the second transistor of the second current sense amplifier.

11. The current sensing circuit according to claim 10, wherein the circuit comprises a symmetric sensing scheme.

12. A current sense amplifier, comprising:
a voltage comparator having a first input, a second input and an output
a first clamping device coupled between the first input of the voltage comparator and a first input signal, the first clamping device being coupled to a reference voltage;
a second clamping device coupled between the second input of the voltage comparator and a second input signal, the second clamping device being coupled to the reference voltage;
a load device having a first side and a second side, wherein the load device comprises a current mirror, and
a multiplexer, wherein the multiplexer is adapted to select whether the first input signal or second input signal is coupled to the first or second side of the load device.

13. The current sense amplifier according to claim 12, wherein the current mirror first side includes a first transistor coupled between a voltage source and the first clamping device and the current mirror second side includes a second transistor coupled between the voltage source and the second clamping device, the first and second transistor gates being coupled together, the gate and drain of the second transistor being coupled together.

14. The current sense amplifier according to claim 13, further comprising at least one capacitive device coupled across the drain and source of the first transistor of the current mirror, wherein the at least one capacitor is adapted to balance capacitive loads of the current mirror.

15. The current sense amplifier according to claim 12, wherein the multiplexer is coupled between the first input signal and the first clamping device, and between the second input signal and the second clamping device.

16. The current sense amplifier according to claim 12, wherein the multiplexer is coupled between the first clamping device, the first input of the voltage comparator and the load device, and between the second clamping device, the second input of the voltage comparator and the load device.

17. The current sense amplifier according to claim 12, wherein the multiplexer comprises the first clamping device and the second clamping device.

18. The current sense amplifier according to claim 17, wherein the first clamping device comprises a third transistor and a fourth transistor, wherein a first analog signal is coupled to the gate of the third transistor and a second analog signal is coupled to the gate of the fourth transistor, wherein the second clamping device comprises a fifth transistor and a sixth transistor, wherein the first analog signal is coupled to the gate of the fifth transistor and the second analog signal is coupled to the gate of the sixth transistor, wherein the first and second analog signals select whether the first input signal or second input signal is coupled to the first or second side of the load device.

19. The current sense amplifier according to claim 12, further comprising a first equalizing transistor coupled between the inputs of the voltage comparator, and a second equalizing transistor coupled between the first input signal and the second input signal.

20. The current sense amplifier according to claim 12, wherein the first input signal comprises a current from a selected memory cell being read, wherein the second input signal comprises a current from at least one reference cell, and wherein the voltage comparator outputs a logic state of the selected memory cell.

21. The current sense amplifier according to claim 20, wherein the reference current comprises the averaged current from at least two reference cells.

22. A current sensing circuit, comprising:
a first current sense amplifier comprising:
a voltage comparator having a first input, a second input and an output;
a first clamping device coupled between the first input of the voltage comparator and a first input signal, the first clamping device being coupled to a reference voltage;
a second clamping device coupled between the second input of the voltage comparator and a second input signal, the second clamping device being coupled to the reference voltage;
a current mirror having a first side and a second side; and
a multiplexer, wherein the multiplexer is adapted to select whether the first input signal or second input signal is coupled to the first or second side of the current mirror; and
a second current sense amplifier comprising:
a voltage comparator having a first input, a second input and an output;
a first clamping device coupled between the first input of the voltage comparator and a first input signal, the first clamping device being coupled to a reference voltage;
a second clamping device coupled between the second input of the voltage comparator and a second input signal, the second clamping device being coupled to the reference voltage;
a current mirror having a first side and a second side; and
a multiplexer, wherein the multiplexer is adapted to select whether the first input signal or second input signal is coupled to the first or second side of the current mirror;
wherein the first and second current sense amplifiers are coupled at second transistors of the current mirrors of the first and second current sense amplifiers.

23. The current sensing circuit according to claim 22, wherein the first and second current sense amplifiers are coupled at the second clamping devices of the first and second current sense amplifiers.

24. The current sensing circuit according to claim 22, wherein the circuit comprises a symmetric sensing scheme.

25. The current sensing circuit according to claim 22, wherein the first and second current sense amplifiers are coupled at the drains of the second transistors of the current mirrors of the first and second current sense amplifiers.

26. The current sensing circuit according to claim 22, wherein the first and second current sense amplifiers are coupled at the sources of the second clamping devices of the first and second current sense amplifiers.

27. A method of sensing current, comprising:
providing a first transistor and a second transistor;
providing a first input signal having a first voltage and a first current;
clamping the first voltage and passing the first current to the first transistor;
providing a second input signal having a second voltage and a second current;

clamping the second voltage and passing the second current to the second transistor, wherein the first input signal and second input signal comprise either current from a selected memory cell or current from at least one reference cell;

selectively mirroring the first or second current from the first or second transistor to the second or first transistor; and comparing the voltage across the first or second transistor to the voltage across the second or first transistor, wherein selectively mirroring the current amplifies the voltage difference between the voltage across the first transistor and the voltage across the second transistor, wherein the selective mirroring is by multiplexing devices.

28. The method according to claim 27, wherein the first transistor and second transistor voltage difference indicates a resistive state of the selected memory cell.

29. The method according to claim 27, wherein the memory device comprises a symmetric sensing architecture, wherein the sensing current method is symmetric.

30. A current sense amplifier, comprising:
a voltage comparator having a first input, a second input and an output;
a first clamping device coupled between the first input of the voltage comparator and a first input signal, the first clamping device being coupled to a reference voltage;
a second clamping device coupled between the second input of the voltage comparator and a second input signal, the second clamping device being coupled to the reference voltage;
a configurable load device coupled between the first and second input of the voltage comparator;
a first equalizing transistor coupled between the inputs of the voltage comparator; and
a second equalizing transistor coupled between the first input signal and the second input signal.

31. The current sense amplifier according to claim 30, further comprising:
a first cascode device coupled between the configurable load device and the first clamping device; and
a second cascode device coupled between the configurable load device and the second clamping device.

32. The current sense amplifier according to claim 30, wherein the first input signal comprises a current from a selected memory cell being read, wherein the second input signal comprises a reference current of at least one reference cell, and wherein the voltage comparator outputs a logic state of the selected memory cell.

33. The current sense amplifier according to claim 32, wherein the reference current comprises the averaged current from at least two reference cells.

34. A current sense amplifier, comprising:
a voltage comparator having a first input, a second input and an output;
a first clamping device coupled between the first input of the voltage comparator and a first input signal, the first clamping device being coupled to a reference voltage;
a second clamping device coupled between the second input of the voltage comparator and a second input signal, the second clamping device being coupled to the reference voltage;
a load device having a first side and a second side; and
a multiplexer coupled between the first clamping device, the first input of the voltage comparator and the load device, and between the second clamping device, the second input of the voltage comparator and the load device, wherein the multiplexer is adapted to select whether the first input signal or second input signal is coupled to the first or second side of the load device.

35. A current sense amplifier, comprising:
a voltage comparator having a first input, a second input and an output;
a first clamping device coupled between the first input of the voltage comparator and a first input signal, the first clamping device being coupled to a reference voltage;
a second clamping device coupled between the second input of the voltage comparator and a second input signal, the second clamping device being coupled to the reference voltage;
a load device having a first side and a second side;
a multiplexer comprising the first clamping device and the second clamping device, wherein the first clamping device comprises a third transistor and a fourth transistor, wherein a first analog signal is coupled to the gate of the third transistor and a second analog signal is coupled to the gate of the fourth transistor, wherein the second clamping device comprises a fifth transistor and a sixth transistor, wherein the first analog signal is coupled to the gate of the fifth transistor and the second analog signal is coupled to the gate of the sixth transistor, wherein the first and second analog signals select whether the first input signal or second input signal is coupled to the first or second side of the load device, and wherein the multiplexer is adapted to select whether the first input signal or second input signal is coupled to the first or second side of the load device.

36. A current sense amplifier, comprising:
a voltage comparator having a first input, a second input and an output;
a first clamping device coupled between the first input of the voltage comparator and a first input signal, the first clamping device being coupled to a reference voltage;
a second clamping device coupled between the second input of the voltage comparator and a second input signal, the second clamping device being coupled to the reference voltage;
a first equalizing transistor coupled between the inputs of the voltage comparator;
a second equalizing transistor coupled between the first input signal and the second input signal;
a load device having a first side and a second side; and
a multiplexer, wherein the multiplexer is adapted to select whether the first input signal or second input signal is coupled to the first or second side of the load device.

* * * * *